United States Patent
Sarkar et al.

(10) Patent No.: US 10,613,571 B2
(45) Date of Patent: Apr. 7, 2020

(54) COMPENSATION CIRCUIT FOR GENERATING READ/PROGRAM/ERASE VOLTAGE

(71) Applicant: Samsung Electronics Co., Ltd., Suwon-si, Gyeonggi-do (KR)

(72) Inventors: Surojit Sarkar, Hwaseong-si (KR); Vivek Venkata Kalluru, Suwon-si (KR); Youngsun Min, Hwaseong-si (KR); Ji-Hoon Lim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/256,410

(22) Filed: Jan. 24, 2019

(65) Prior Publication Data

US 2019/0377377 A1    Dec. 12, 2019

(30) Foreign Application Priority Data

Jun. 8, 2018   (KR) .................... 10-2018-0066044

(51) Int. Cl.
  *G05F 3/26*   (2006.01)
  *G05F 3/24*   (2006.01)
  (Continued)

(52) U.S. Cl.
  CPC ....... *G05F 3/262* (2013.01); *G01R 19/16552* (2013.01); *G05F 3/245* (2013.01); *G11C 5/147* (2013.01)

(58) Field of Classification Search
  None
  See application file for complete search history.

(56) References Cited

U.S. PATENT DOCUMENTS 7,471,582 B2    12/2008   Choy et al.
7,675,792 B2    3/2010    Bedeschi et al.
(Continued)

OTHER PUBLICATIONS

Kang, et al.; *256 Gb 3 b/Cell V-NAND Flash Memory with 48 Stacked WL Layers*; IEEE Journal of Solid State Circuits, vol. 52, No. 1; Jan. 2017; pp. 210-217.
(Continued)

*Primary Examiner* — Jeffrey A Gblende
(74) *Attorney, Agent, or Firm* — Sughrue Mion, PLLC

(57) ABSTRACT

A compensation circuit may include a reference current generating circuit including a first transistor of a first width configured to transfer a first current. The reference generating circuit may output a reference current based on the first current. The compensation circuit may include a compensation current generating circuit including a second transistor of a second width configured to transfer a second current. The second transistor may be selected from among a first group of transistors based on a code. The transistors of the first group may have widths proportional to the first width. The compensation current generating circuit may output a compensation current having a magnitude selected proportionally to a magnitude of the reference current based on the second current. The compensation circuit may include a current mirror circuit configured to output a compensation voltage having a magnitude based on a magnitude of the second current and the second width.

20 Claims, 16 Drawing Sheets

(51) Int. Cl.
*G01R 19/165* (2006.01)
*G11C 5/14* (2006.01)

(56) References Cited

U.S. PATENT DOCUMENTS

| | | | |
|---|---|---|---|
| 8,067,992 | B2 | 11/2011 | Chen et al. |
| 8,284,624 | B2 | 10/2012 | Kim et al. |
| 2004/0207380 | A1 | 10/2004 | Ariki |
| 2005/0031256 | A1 | 2/2005 | Paatzsch et al. |
| 2005/0073286 | A1* | 4/2005 | Ke .................. G05F 1/575 323/280 |
| 2012/0153921 | A1* | 6/2012 | Brokaw ............ H02M 3/156 323/288 |
| 2014/0285180 | A1 | 9/2014 | Foote |
| 2015/0061621 | A1* | 3/2015 | Pons ................. G05F 1/56 323/280 |
| 2016/0187207 | A1 | 6/2016 | Li |
| 2016/0265983 | A1* | 9/2016 | Hsu .................. G01K 13/00 |
| 2017/0011806 | A1* | 1/2017 | Gangasani ........... G11C 16/30 |
| 2017/0147019 | A1* | 5/2017 | Kim .................. G05F 1/468 |

OTHER PUBLICATIONS

Miyaji, et al.; *An Integrated Variable Positive/Negative Temperature Coefficient Read Reference Generator for MLC PCM/NAND Hybrid 3D SSD*; IEEE Asian Solid-State Circuits Conference; Nov. 12-14, 2012; Kobe, Japan; pp. 313-316.

Tanzawa, et al.; *A Temperature Compensation Word-Line Voltage Generator for Multi-Level Cell NAND Flash Memories*; 978-1-4244-6664-1/10; IEEE; (2010); pp. 106-109.

Su, et al.; *Differential Amplifiers with Enhanced Linearity and Temperature Compensation*, 978-1-4799-7800-7/15; IEEE; (2015); pp. 1438-1444.

Abdulaziz, et al., *A Linearization Technique for Differential OTAs*; IEEE Transactions on Circuits and Systems—II: Express Briefs, vol. 64; No. 9; Sep. 2017; pp. 1002-1006.

* cited by examiner

COMPENSATION CIRCUIT FOR GENERATING READ/PROGRAM/ERASE VOLTAGE

CROSS-REFERENCE TO RELATED APPLICATIONS

This application claims priority under 35 U.S.C. § 119 to Korean Patent Application No. 10-2018-0066044 filed on Jun. 8, 2018, in the Korean Intellectual Property Office, the entire contents of which are hereby incorporated by reference herein in their entireties.

FIELD

Embodiments of the inventive concepts disclosed herein relate to electronic circuits, and more particularly, relate to electronic circuits included in a memory device.

BACKGROUND

As the development of information devices such as a computer, a mobile phone, and a smartphone progresses, large amounts of information may be stored in and processed by the information devices. Accordingly, memory devices of higher performance may be used as components of information devices. Since semiconductor memory may operate with a low power, the semiconductor memory may be used in a memory device.

Examples of semiconductor memory may include volatile memories and nonvolatile memories. Examples of volatile memories may include static random access memory (SRAM), dynamic RAM (DRAM), synchronous DRAM (SDRAM), etc. Examples of nonvolatile memories may include flash memory, phase-change RAM (PRAM), magneto-resistive RAM (MRAM), resistive RAM (ReRAM), ferroelectric RAM (FRAM), etc.

A semiconductor memory may include a memory cell for storing data. Data stored in the memory cell may be read as a voltage of a specific magnitude is supplied to the memory cell. Characteristics of the memory cell may be affected by conditions such as a temperature. Accordingly, to accurately sense (read/program/erase) data stored in the memory cell, a magnitude of a supplied voltage having a magnitude that may be determined in consideration of the conditions having an influence on the memory cell.

SUMMARY

Some embodiments of the inventive concepts may provide an electronic circuit configured to generate a voltage for sensing data stored in a memory device.

According to some embodiments, a compensation circuit may be provided. The compensation circuit may include a reference current generating circuit, a compensation current generating circuit, a current mirror circuit, and an output transistor. The reference current generating circuit may include a first transistor of a first width configured to transfer a first current and may be configured to output a reference current based on the first current. The compensation current generating circuit may include a second transistor of a first width that is selected from among a first group of transistors based on a code. The transistors of the first group may have widths proportional to the first width. The compensation current generating circuit may be configured to output a compensation current having a magnitude selected proportionally to a magnitude of the reference current based on the second current. The current mirror circuit may be configured to output a compensation voltage having a magnitude that is based on a magnitude of the second current. The output transistor may be configured to output a sensing voltage based on the compensation voltage. The code may have a first value, a second value, and a third value. A difference between the first value and the second value may be identical to a difference between the second value and the third value. A difference between a first magnitude of the voltage output based on the first value and a second magnitude of the voltage output based on the first value may correspond to a difference between the second magnitude and a third magnitude of the voltage output based on the third value.

According to some embodiments, a compensation circuit may be provided. The compensation circuit may include a reference current generating circuit configured to output a reference current of a fixed magnitude. The compensation circuit may include a compensation current generating circuit configured to output a compensation current having a magnitude selected proportionally to a magnitude of the reference current based on a code. The compensation circuit may include a current mirror circuit configured to output to the reference current generating circuit a first current based on the reference current, to output a second current based on the compensation current, and to output a compensation voltage based on the first current and the second current. The compensation circuit may include an output transistor configured to output a sensing voltage based on the compensation voltage. A magnitude of the sensing voltage may be associated with a magnitude of the second current such that the magnitude of the sensing voltage is a reference magnitude when the code is a reference value, and the magnitude of the second current is increased by the reference magnitude when a value of the code is increased by the reference value.

According to some embodiments, a voltage generating circuit may be provided. The voltage generating circuit may include a compensation circuit configured to output a compensation voltage having a magnitude that is based on a code, based on a first temperature dependent voltage, and based on a second temperature dependent voltage. The first voltage may have a magnitude which varies with a temperature and the second voltage may have a magnitude that is uniform regardless of the temperature. The voltage generating circuit may include an output transistor configured to output a sensing voltage having a magnitude that is based on a magnitude of the compensation voltage. The voltage generating circuit may be configured to produce the sensing voltage having a magnitude that is proportional to a value of the code, and is associated with a difference between a magnitude of the first temperature dependent voltage and a magnitude of the second temperature dependent voltage.

BRIEF DESCRIPTION OF THE FIGURES

The above and other objects and features of the inventive concepts will become apparent by describing in detail example embodiments thereof with reference to the accompanying drawings.

DETAILED DESCRIPTION

Some embodiments of the inventive concepts may be described in detail and clearly to such an extent to enable a person of ordinary skill in the art to easily implement the inventive concepts.

As used herein, the term "width" may refer to a width of a channel of a transistor. That is, the width may refer to a length of a direction (e.g., a vertical direction) crossing a direction in which charges transfer in the channel of the transistor. The transistor may be configured to have a width of a specific size.

As used herein, the term "code" may refer to data expressed in the form of a binary number. An n-bit code may be expressed by "n" successive logical values (logical value "1" or logical value "0"). For example, values of a 2-bit code may include "00", "01", "10", and "11".

As used herein, expressions "a level of a voltage is proportional to a value of a code" or "a level of a voltage varies linearly to a value of a code" may be used. That a level of a voltage is proportional to a value of a code or varies linearly to the value of the code may refer to a difference between the magnitude of a voltage corresponding to a value of a "q-th" code of "n" codes and the magnitude of a voltage corresponding to a "(q+1)-th" code being substantially identical to a difference between the magnitude of a voltage corresponding to a value of a "(q+1)-th" code and the magnitude of a voltage corresponding to a "(q+2)-th" code (q being a natural number).

For example, in embodiments where a difference between the magnitude of a voltage corresponding to a code value of "000" and the magnitude of a voltage corresponding to a code value of "001" is substantially identical to a difference between the magnitude of a voltage corresponding to a code value of "001" and the magnitude of a voltage corresponding to a code value of "010", the magnitude of a voltage may be proportional to a code value in a range of a code value from "000" to "010". Alternatively, the magnitude of a voltage may vary linearly to a code value in the range the code value from "000" to "010". However, that two values are substantially identical to each other may include embodiments where two values are not completely identical to each other but only a slight difference is present between the two values, as well as embodiments where the two values are completely identical to each other.

Figure 1:
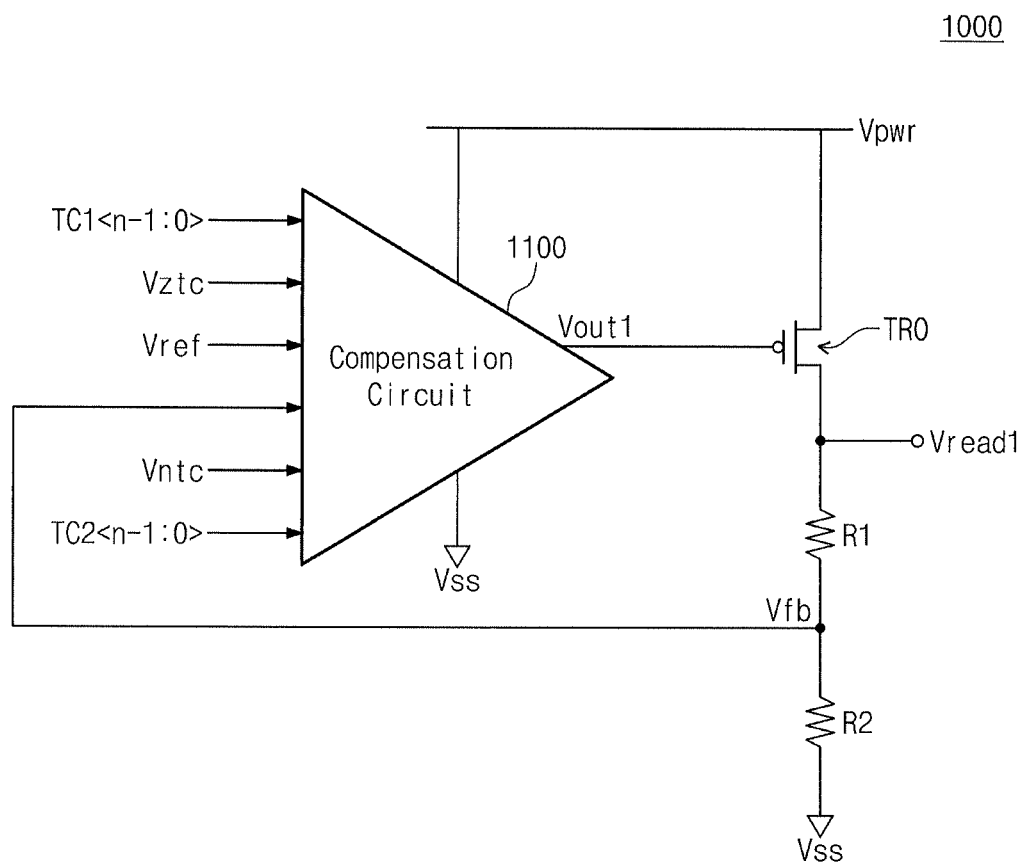
FIG. 1 is a circuit diagram illustrating a read voltage generating circuit according to some embodiments of the inventive concepts.

FIG. 1 is a circuit diagram illustrating a read voltage generating circuit according to some embodiments of the inventive concepts. A read voltage generating circuit 1000 configured to generate a read voltage Vreal used for reading data will be described with reference to FIG. 1, however, it may be understood that the read voltage generating circuit 1000 may generate not only read voltage Vread1 but, in some embodiments, also other voltages for various purposes. For example, the read voltage generating circuit 1000 may generate a voltage for sensing (reading, programming, erasing etc.) data.

Referring to FIG. 1, the read voltage generating circuit 1000 may include a compensation circuit 1100, a transistor TR0, a resistor R1, and a resistor R2.

The compensation circuit 1100 may receive codes TC1 and TC2, voltages Vztc, Vntc, Vpwr, and Vss, a reference voltage Vref, and a feedback voltage Vfb. For example, as will be described with reference to FIG. 16, the compensation circuit 1100 may be a component of a memory device included in a memory system. The memory system may include a logic circuit for generating the codes TC1 and TC2. For example, the logic circuit may be included in a component such as a memory controller. The compensation circuit 1100 may receive the codes TC1 and TC2 from the logic circuit.

For example, the memory system may include a voltage generator. The voltage generator may generate the voltages Vztc, Vntc, and Vpwr and the reference voltage Vref, which may be used to operate the read voltage generating circuit 1000. The compensation circuit 1100 may receive the voltages Vztc, Vntc, and Vpwr and the reference voltage Vref from the voltage generator. The compensation circuit 1100 may be electrically connected to a node between the resistor R1 and the resistor R2. The compensation circuit 1100 may receive the feedback voltage Vfb from the node between the resistor R1 and the resistor R2. The voltage Vss may be a voltage of an equipotential terminal. For example, the voltage Vss may be a ground voltage.

The compensation circuit 1100 may output a voltage Vout1 based on the codes TC1 and TC2 and the voltages Vztc, Vntc, Vref, Vpwr, and Vss. The compensation circuit

1100 may output the voltage Vout1 to a gate terminal of the transistor TR0. A configuration and an operation of the compensation circuit 1100 will be described with reference to FIGS. 2 and 3.

The transistor TR0 may include a gate terminal receiving the voltage Vout1 from the compensation circuit 1100. The transistor TR0 may include a first end receiving the voltage Vpwr. A second end of the transistor TR0 may be electrically connected to a first end of the resistor R1. A read voltage Vread1 may be output from a node between the transistor TR0 and the first end of the resistor R1. A second end of the resistor R1 may be electrically connected to a first end of the resistor R2. A second end of the resistor R2 may be electrically connected to the equipotential terminal supplying the voltage Vss.

As the voltage Vout1 is applied to the gate terminal of the transistor TR0, a current may flow through the transistor TR0. As the current flows through the transistor TR0, the read voltage Vread1 may be formed at the node between the transistor TR0 and the resistor R1. The magnitude of the voltage Vread1 may be associated with the magnitude of the voltage Vout1. The read voltage generating circuit 1000 may output the read voltage Vread1 to another component of the memory system (e.g., a memory cell in a memory device). The memory device may output a data signal indicating data stored in a memory cell, based on the read voltage Vread1 (refer to FIG. 16).

The voltage Vread1 may be divided by the resistor R1 and the resistor R2. In embodiments where the magnitude of the voltage Vss is "Vss", the magnitude of the voltage Vread1 is "Vread1", the magnitude of the resistor R1 is "R1", and the magnitude of the resistor R2 is "R2", the magnitude of the feedback voltage Vfb may be expressed by the equation "(Vread1−Vss)*R2/(R1+R2)". In embodiments where the magnitude of the feedback voltage Vfb is "Vfb" and the magnitude of the voltage Vss is "0", the magnitude of the voltage Vread1 may be expressed by the equation "(1+(R1/R2))*Vfb". Accordingly, the magnitude of the feedback voltage Vfb may be associated with the magnitude of the voltage Vread1 and the magnitude of the feedback voltage Vfb may be associated with the magnitude of the voltage Vout1.

Each of the codes TC1 and TC2 may be expressed as being composed of "n" bits (n being a natural number). In some embodiments, the codes TC1 and TC2 may have values complementary to each other. For example, when a value of the code TC1 is "000000", a value of the code TC2 may be "111111". The code TC1 may include a least significant bit TC1<0> to a most significant bit TC1<n−1>. The code TC2 may include a least significant bit TC2<0> to a most significant bit TC2<n−1>. For example, in embodiments where the code TC1 and the code TC2 are each a 6-bit code, the code TC1 and the code TC2 may have one of values from "000000" to "111111" and a complementary one of the values from "000000" to "111111", respectively.

The logic circuit may generate the codes TC1 and TC2 based on various conditions associated with the memory device of the memory system. The memory device may supply a read voltage of a specific magnitude for the purpose of reading data stored in a memory cell. The magnitude of a threshold voltage of the memory cell may vary with various conditions (e.g., a temperature and a stress etc.). Accordingly, the magnitude of the read voltage useful to accurately read data may also vary with the various conditions. As used herein, a temperature may refer to a temperature of the memory system including the read voltage generating circuit 1000.

For example, the magnitude of the threshold voltage of the memory cell may increase as a temperature decreases. The read voltage of an increased magnitude may be used to accurately read data stored in the memory cell having the threshold voltage of the increased magnitude. The logic circuit may track the threshold voltage of the memory cell. The logic circuit may determine the magnitude of the read voltage useful to accurately read data stored in the memory cell, based on the tracked threshold voltage. The logic circuit may determine the magnitude of the voltage Vout1, based on a relationship between the read voltage Vread1 and the voltage Vout1. The logic circuit may determine the codes TC1 and TC2 such that the read voltage Vread1 having the determined magnitude is output from the read voltage generating circuit 1000.

One or more of the magnitudes of the voltages Vztc and/or Vntc may be associated with a temperature. For example, the magnitude of the voltage Vztc may be uniform regardless of a change in temperature. The magnitude of the voltage Vntc may decrease as a temperature increases. In the specification, for convenience of description, an ideal embodiment may be described with regard to the voltage Vztc having the uniform magnitude regardless of a change of a temperature and the voltage Vntc having a magnitude proportional to a temperature. However, in some embodiments, the actual magnitudes of the voltages Vztc and Vntc may be slightly different from the magnitudes of the voltages Vztc and Vntc of the ideal embodiment. A relationship between the voltages Vztc and Vntc and a temperature will be described with reference to FIG. 12.

Figure 2:
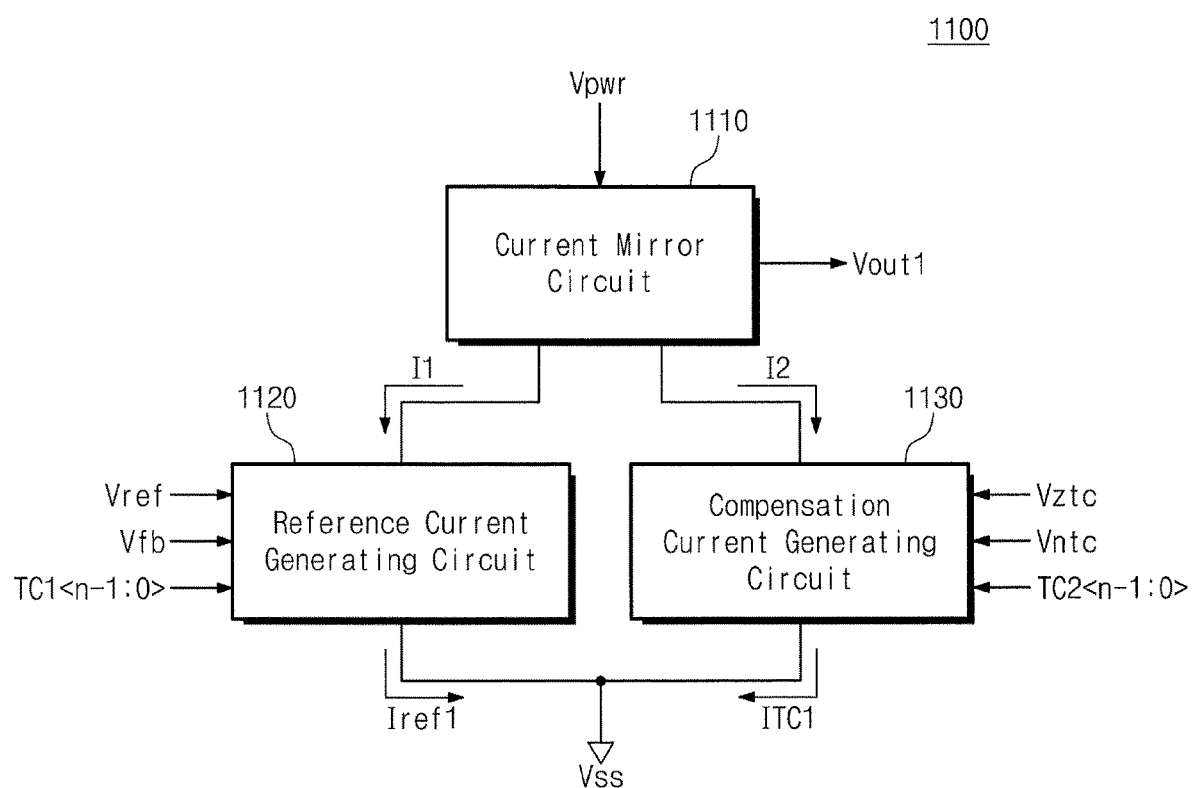
FIG. 2 is a block diagram illustrating an example configuration of the compensation circuit of FIG. 1 according to some embodiments of the inventive concepts.

FIG. 2 is a block diagram illustrating an example configuration of the compensation circuit of FIG. 1 according to some embodiments of the inventive concepts.

Referring to FIG. 2, the compensation circuit 1100 may include a current mirror circuit 1110, a reference current generating circuit 1120, and a compensation current generating circuit 1130. The current mirror circuit 1110 may receive the voltage Vpwr. The current mirror circuit 1110 may output the voltage Vout1 to the gate terminal of the transistor TR0 of FIG. 1. The current mirror circuit 1110 may be electrically connected to the reference voltage generating circuit 1120. The current mirror circuit 1110 may be electrically connected to the compensation current generating circuit 1130.

The reference current generating circuit 1120 may receive the reference voltage Vref, the feedback voltage Vfb, and the code TC1. The compensation current generating circuit 1130 may receive the voltage Vztc, the voltage Vntc, and the code TC2. The reference current generating circuit 1120 and the compensation current generating circuit 1130 may be electrically connected to the equipotential terminal supplying the voltage Vss.

The reference current generating circuit 1120 may generate a reference current Iref1 based on the received reference voltage Vref, the received feedback voltage Vfb, and the received code TC1. The reference current generating circuit 1120 may output the reference current Iref1 to the equipotential terminal. The compensation current generating circuit 1130 may generate a compensation current ITC1 based on the received voltage Vztc, the received voltage Vntc, and the received code TC2. The compensation current generating circuit 1130 may output the compensation current ITC1 to the equipotential terminal.

As the reference current Iref1 is generated by the reference current generating circuit 1120, the reference current generating circuit 1120 may receive a current I1 from the current mirror circuit 1110. As the compensation current ITC1 is generated by the compensation current generating circuit 1130, the compensation current generating circuit 1130 may receive a current I2 from the current mirror circuit 1110. As the current I1 and the current I2 are output from the current mirror circuit 1110, the voltage Vout1 may be formed in the current mirror circuit 1110. The current mirror circuit 1110 may output the voltage Vout1 to the transistor TR0 of FIG. 1.

The current mirror circuit 1110 may be a first stage amplifier configured to output the voltage Vout1. The transistor TR0 may be a second stage amplifier configured to output the read voltage Vread1.

The magnitude of the voltage Vout1 may be associated with a temperature. Also, the magnitude of the voltage Vout1 may be associated with the code TC1 and the code TC2. Accordingly, the magnitude of the read voltage Vread1 may be associated with the temperature and the codes TC1 and TC2. Hereinafter, operations of the current mirror circuit 1110, the reference current generating circuit 1120, and the compensation current generating circuit 1130 will be described with reference to FIG. 3.

Figure 3:
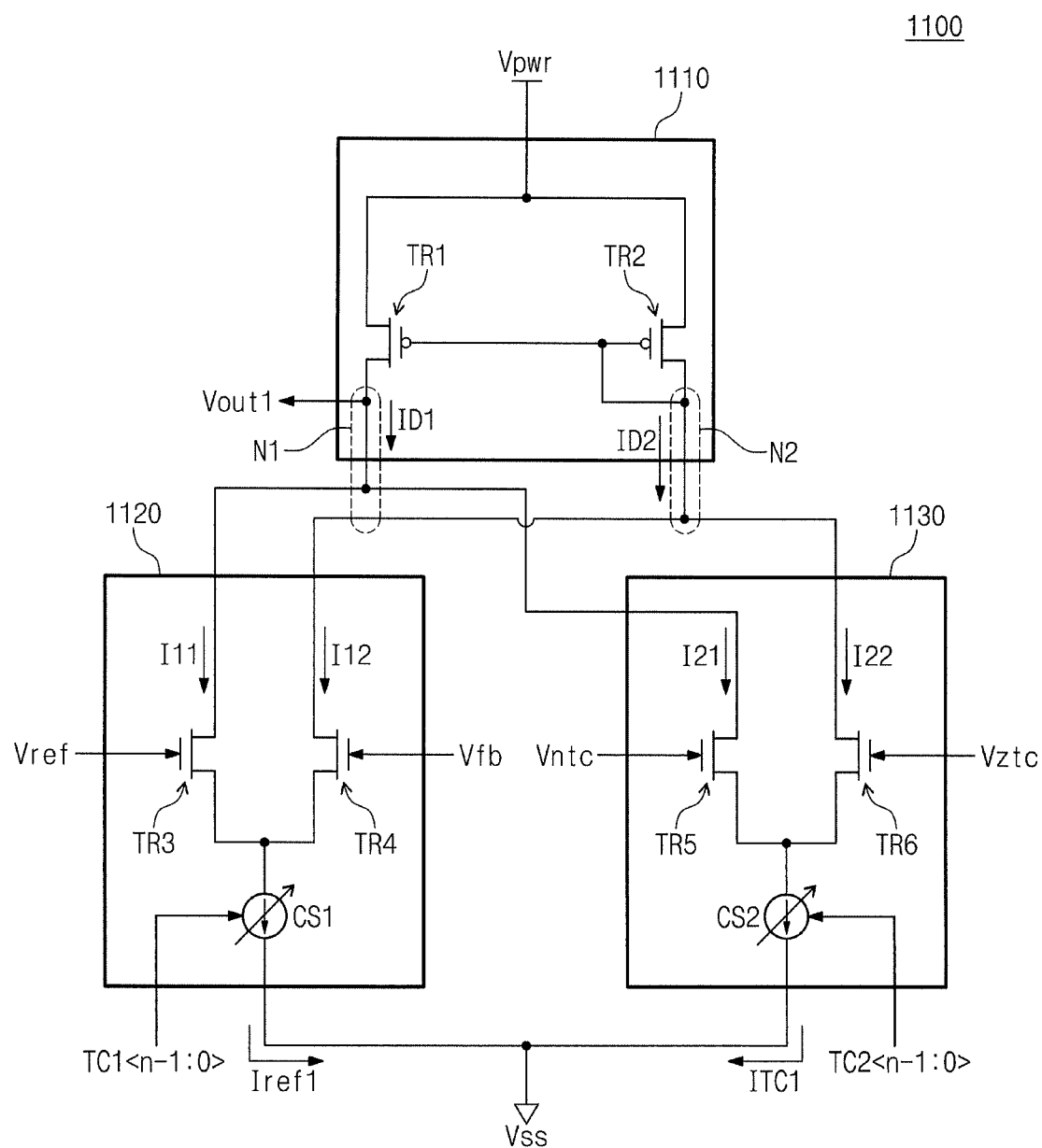
FIG. 3 is a circuit diagram illustrating an example configuration of the compensation circuit of FIG. 1 according to some embodiments of the inventive concepts.

FIG. 3 is a circuit diagram illustrating an example configuration of the compensation circuit of FIG. 1 according to some embodiments of the inventive concepts.

Referring to FIG. 3, the current mirror circuit 1110 may include a transistor TR1 and a transistor TR2. The reference current generating circuit 1120 may include a transistor TR3, a transistor TR4, and a current source CS1. The compensation current generating circuit 1130 may include a transistor TR5, a transistor TR6, and a current source CS2.

The transistor TR1 may include a first end receiving the voltage Vpwr. A second end of the transistor TR1 may be electrically connected to a node N1. The transistor TR2 may include a first end receiving the voltage Vpwr. A gate terminal of the transistor TR1 may be electrically connected to a gate terminal of the transistor TR2, a second end of the transistor TR2, and a node N2.

The transistor TR3 may include a gate terminal receiving the reference voltage Vref. A first end of the transistor TR3 may be electrically connected to the node N1. A second end of the transistor TR3 may be electrically connected to the current source CS1. The transistor TR4 may include a gate terminal receiving the feedback voltage Vfb. A first end of the transistor TR4 may be electrically connected to the node N2. A second end of the transistor TR4 may be electrically connected to the current source CS1. The current source CS1 may be electrically connected to the equipotential terminal supplying the voltage Vss.

The transistor TR5 may include a gate terminal receiving the voltage Vntc. A first end of the transistor TR5 may be electrically connected to the node N1. A second end of the transistor TR5 may be electrically connected to the current source CS2. The transistor TR6 may include a gate terminal receiving the voltage Vztc. A first end of the transistor TR6 may be electrically connected to the node N2. A second end of the transistor TR6 may be electrically connected to the current source CS2. The current source CS2 may be electrically connected to the equipotential terminal supplying the voltage Vss.

The current source CS1 may output the reference current Iref1 having a variable. The current source CS1 may control the magnitude of the reference current Iref1 based on the code TC1. For example, the current source CS1 may control the magnitude of the reference current Iref1 to be negatively proportional to a value of the code TC1. A sum of the magnitude of a current I11 flowing through the transistor TR3 and the magnitude of a current I12 flowing through the transistor TR4 may correspond to the magnitude of the reference current Iref1.

The current source CS2 may output the compensation current ITC1 having a variable. For example, the current source CS2 may control the magnitude of the compensation current ITC1 based on the code TC2. For example, the current source CS2 may control the magnitude of the compensation current ITC1 to be positively proportional to a value of the code TC2. A sum of the magnitude of a current I21 flowing through the transistor TR5 and the magnitude of a current I22 flowing through the transistor TR6 may correspond to the magnitude of the compensation current ITC1.

The magnitude of the current I11 flowing through the transistor TR3 and the magnitude of the current I12 flowing through the transistor TR4 may vary as the magnitude of the reference current Iref1 varies. The magnitude of the current I21 flowing through the transistor TR5 and the magnitude of the current I22 flowing through the transistor TR6 may vary as the magnitude of the compensation current ITC1 varies. As the magnitude of the current I1 flowing through the transistor TR3 and the magnitude of the current I21 flowing through the transistor TR5 vary, the magnitude of a current ID1 flowing through the transistor TR1 may vary. As the magnitude of the current I12 flowing through the transistor TR4 and the magnitude of the current I22 flowing through the transistor TR6 vary, the magnitude of a current ID2 flowing through the transistor TR2 may vary.

Referring together to FIGS. 2 and 3, the magnitude of the current I1 of FIG. 2 may correspond to a sum of the magnitude of the current I11 and the magnitude of the current I12. The magnitude of the current I2 of FIG. 2 may correspond to a sum of the magnitude of the current I21 and the magnitude of the current I22. As the current I11 and the current I12 flow, the voltage Vout1 may be formed at the node N1. As described with reference to FIG. 1, the feedback voltage Vfb may be formed at the node between the resistor R1 and resistor R2, and the read voltage Vread1 may be output from the read voltage generating circuit 1000. The magnitude of the feedback voltage Vfb may be expressed by Equation 1.

$$Vfb = Vref + \alpha*(Vntc - Vztc) \quad \text{[Equation 1]}$$

In Equation 1, "Vfb" may represent the magnitude of the feedback voltage Vfb, "Vref" may represent the magnitude of the reference voltage Vref, "Vntc" may represent the magnitude of the voltage Vntc, and "Vztc" may represent the magnitude of the voltage Vztc. "α" in Equation 1 may be expressed by Equation 2.

$$\alpha = k * \sqrt{\frac{W\_5 * I21}{W\_4 * I12}} \quad \text{[Equation 2]}$$

In Equation 2, "W_4" may represent a width of the transistor TR4, "I12" may represent the magnitude of the current I12, "W_5" may represent a width of the transistor TR5, "I21" may represent the magnitude of the current I21, "k" may be a proportional constant which is independent of a temperature, a value of the code TC1, and a value of the code TC2.

The current source CS1 may be configured to output the reference current Iref1 having a magnitude that is negatively proportional to a value of the code TC1. The current source CS2 may be configured to output the compensation current ITC1 having a magnitude that is positively proportional to a value of the code TC2. The magnitude of the current I12 and the magnitude of the current I21 may vary with the magnitudes of the reference current Iref1 and the compensation current ITC1. As such, "α" may vary depending on Equation 2, and the magnitude of the feedback voltage Vfb may vary depending on Equation 1.

As described with reference with FIG. 1, the magnitude of the read voltage Vread1 may correspond to the magnitude of the feedback voltage Vfb. Accordingly, the magnitude of the read voltage Vread1 may vary based on Equation 1. Hereinafter, the read voltage Vread1 may be described with reference to Equation 1 and Equation 2.

The read voltage generating circuit 1000 may be configured to output the read voltage Vread1 having a magnitude that varies with a value of the code TC1 and a value of the code TC2. For example, the read voltage generating circuit 1000 may be configured to output the read voltage Vread1 having a magnitude that becomes greater as a value of the code TC1 and a value of the code TC2 vary.

As described with reference to FIG. 1, the magnitude of the voltage Vntc and/or the magnitude of the voltage Vztc may be associated with a temperature. For example, the magnitude of the voltage Vntc may be negatively proportional to a temperature, and the magnitude of the voltage Vztc may be uniform regardless of a change in temperature. Accordingly, the read voltage generating circuit 1000 may be configured to output the read voltage Vread1 having a magnitude associated with a temperature. For example, the read voltage generating circuit 1000 may be configured to output the read voltage Vread1 having a magnitude that becomes smaller as a temperature increases.

As the magnitude of the read voltage Vread1 varies with a temperature and the codes TC1 and TC2, the magnitude of the read voltage Vread1 may vary with the threshold voltage of the memory cell, which varies with various conditions.

Figure 4:
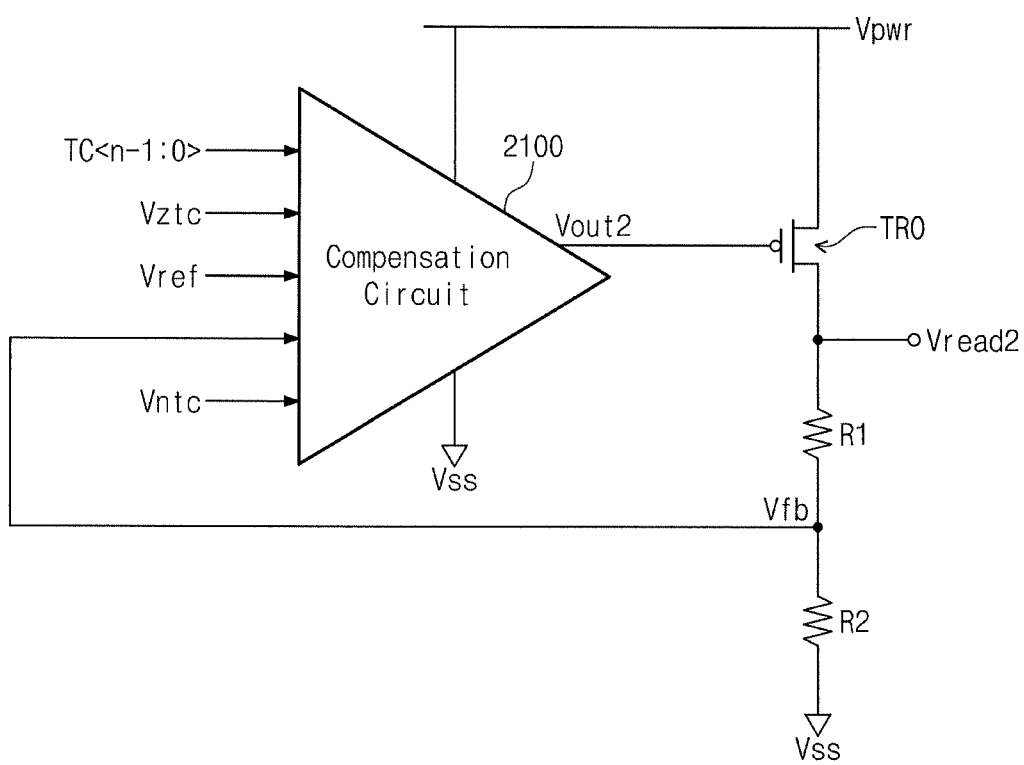
FIG. 4 is a circuit diagram illustrating a read voltage generating circuit according to some embodiments of the inventive concepts.

FIG. 4 is a circuit diagram illustrating a read voltage generating circuit according to some embodiments of the inventive concepts. Compared to FIG. 1, a read voltage generating circuit 2000 of FIG. 4 may include a compensation circuit 2100 instead of the compensation circuit 1100. Some elements of the read voltage generating circuit 2000 of FIG. 4 may be the same as or similar to corresponding elements of the read voltage generating circuit 1000 described with respect to FIGS. 1 to 3 and redundant descriptions may be omitted for brevity.

The compensation circuit 2100 may receive one code TC from the logic circuit. The code TC may be expressed as being composed of "n" bits (n being a natural number). The code TC may include a least significant bit TC<0> to a most significant bit TC<n−1>. For example, in embodiments where the code TC is a 6-bit code, the code TC may have one of values from "000000" to "111111".

For example, a logic circuit may generate the code TC based on various conditions associated with the memory system. A configuration and operations of the read voltage generating circuit 2000 may be similar to the configuration and the operations of the read voltage generating circuit 1000. Thus, additional description may be omitted to avoid redundancy.

Figure 5:
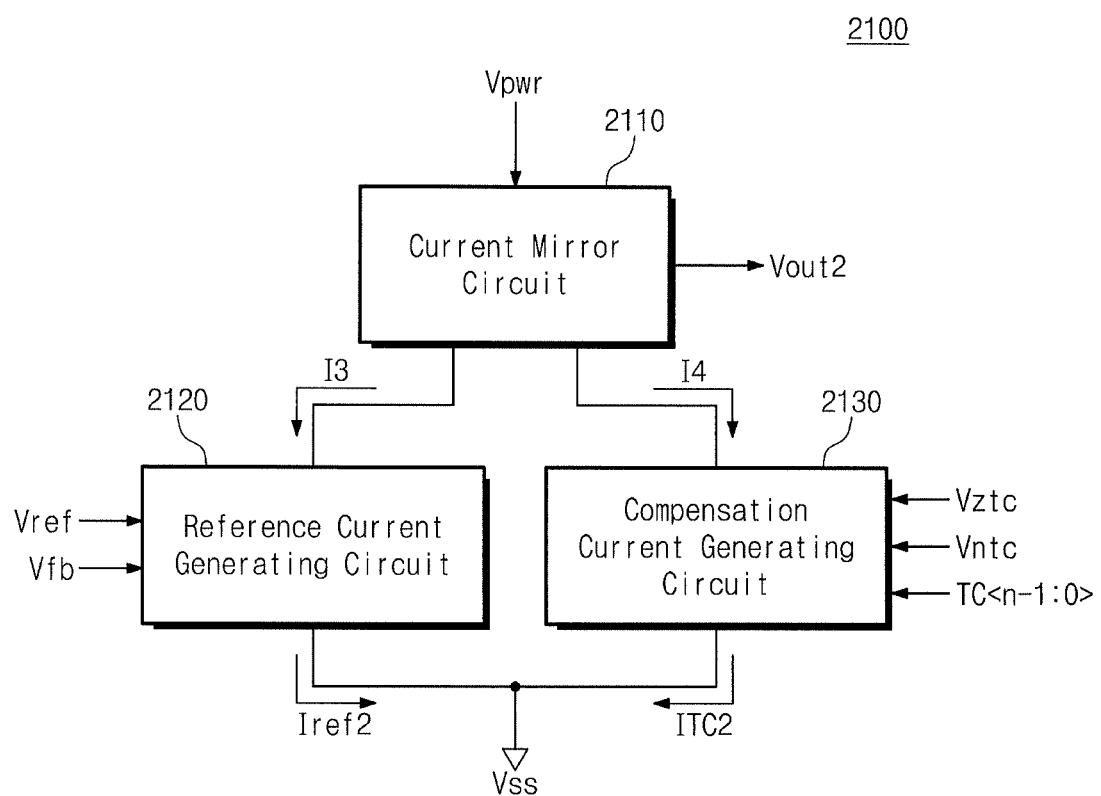
FIG. 5 is a block diagram illustrating an example configuration of the compensation circuit of FIG. 4 according to some embodiments of the inventive concepts.

FIG. 5 is a block diagram illustrating an example configuration of the compensation circuit of FIG. 4 according to some embodiments of the inventive concepts.

Referring to FIG. 5, the compensation circuit 2100 may include a current mirror circuit 2110, a reference current generating circuit 2120, and a compensation current generating circuit 2130. The current mirror circuit 2110 may receive the voltage Vpwr. The current mirror circuit 2110 may output a voltage Vout2 to the gate terminal of the transistor TR0 of FIG. 4. The current mirror circuit 2110 may be electrically connected to the reference current generating circuit 2120 and the compensation current generating circuit 2130.

The reference current generating circuit 2120 may receive the reference voltage Vref and the feedback voltage Vfb. The compensation current generating circuit 2130 may receive the voltage Vztc, the voltage Vntc, and the code TC. The reference current generating circuit 2120 and the compensation current generating circuit 2130 may be electrically connected to the equipotential terminal supplying the voltage Vss.

The reference current generating circuit 2120 may generate a reference current Iref2, based on the received reference voltage Vref and the received feedback voltage Vfb. The reference current generating circuit 2120 may output the reference current Iref2 to the equipotential terminal. The compensation current generating circuit 2130 may generate a compensation current ITC2, based on the received voltage Vztc, the received voltage Vntc, and the received code TC. The compensation current generating circuit 2130 may output the compensation current ITC2 to the equipotential terminal.

As the reference current Iref2 is generated by the reference current generating circuit 2120, the reference current generating circuit 2120 may receive a current I3 from the current mirror circuit 2110. As the compensation current ITC2 is generated by the compensation current generating circuit 2130, the compensation current generating circuit 2130 may receive a current I4 from the current mirror circuit 2110. As the current I3 and the current I4 are output from the current mirror circuit 2110, the current mirror circuit 2110 may output the voltage Vout2 to the transistor TR0 of FIG. 4.

Some operations of the current mirror circuit 2110, the reference current generating circuit 2120, and the compensation current generating circuit 2130 will be described with reference to FIG. 6.

Figure 6:
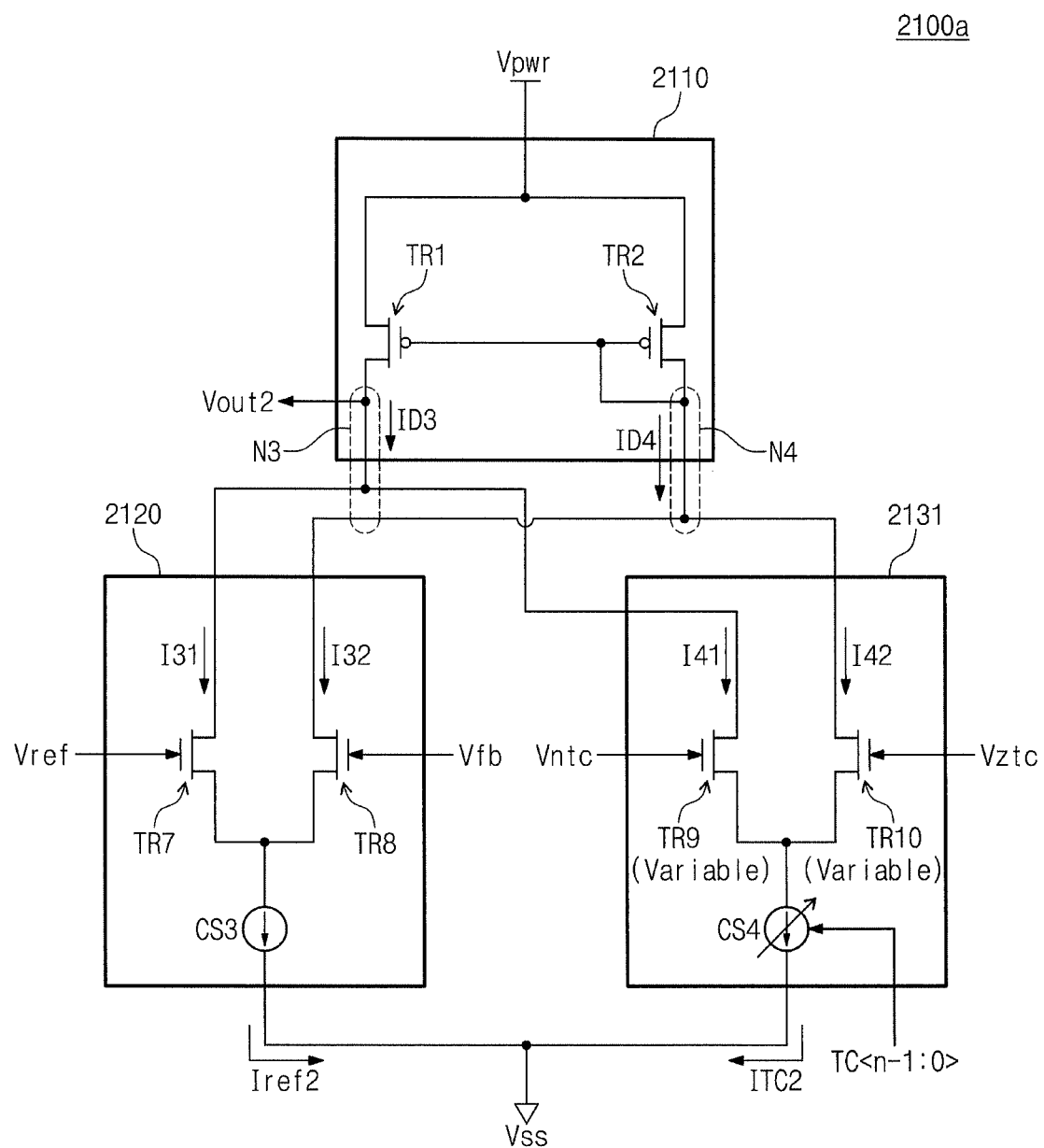
FIG. 6 is a circuit diagram illustrating an example configuration of the compensation circuit of FIG. 4 according to some embodiments of the inventive concepts.

FIG. 6 is a circuit diagram illustrating an example configuration of the compensation circuit of FIG. 4 according to some embodiments of the inventive concepts.

The compensation circuit 2100 of FIG. 4 may include a compensation circuit 2100a of FIG. 6. The compensation current generating circuit 2130 of FIG. 5 may include a compensation current generating circuit 2131 of FIG. 6. Referring to FIG. 6, the current mirror circuit 2110 may include a transistor TR1 and a transistor TR2. The reference current generating circuit 2120 may include a transistor TR7, a transistor TR8, and a current source CS3. The compensation current generating circuit 2131 may include a transistor TR9, a transistor TR10, and a current source CS4.

The transistor TR1 may include a first end receiving the voltage Vpwr. A second end of the transistor TR1 may be electrically connected to a node N3. The transistor TR2 may include a first end receiving the voltage Vpwr. A gate terminal of the transistor TR1 may be electrically connected to a gate terminal of the transistor TR2, a second end of the transistor TR2, and a node N4. The transistor TR1 may transfer the current ID3. The transistor TR2 may transfer the current ID4.

The transistor TR7 may include a gate terminal receiving the reference voltage Vref. A first end of the transistor TR7 may be electrically connected to the node N3. A second end of the transistor TR7 may be electrically connected to a first end of the current source CS3. The transistor TR7 may transfer a current I31. The transistor TR8 may include a gate terminal receiving the feedback voltage Vfb. A first end of the transistor TR8 may be electrically connected to the node N4. A second end of the transistor TR8 may be electrically connected to the first end of the current source CS3. The transistor TR8 may transfer a current I32. A second end of the current source CS3 may be electrically connected to the equipotential terminal supplying the voltage Vss.

The transistor TR9 may include a gate terminal receiving the voltage Vntc. A first end of the transistor TR9 may be electrically connected to the node N3. A second end of the transistor TR9 may be electrically connected to a first end of the current source CS4. The transistor TR9 may transfer a current I41. The transistor TR10 may include a gate terminal receiving the voltage Vztc. A first end of the transistor TR10 may be electrically connected to the node N4. A second end of the transistor TR01 may be electrically connected to the first end of the current source CS4. The transistor TR10 may transfer a current I42. A second end of the current source CS4 may be electrically connected to the equipotential terminal supplying the voltage Vss.

In FIG. 6, each of the transistor TR9 and the transistor TR10 is illustrated as being implemented with one transistor. However, as illustrated for example in FIG. 8, each of the transistor TR9 and the transistor TR10 may be one or more transistors that are selected based on the code TC, from among a plurality of transistors. Transistors which may be selected as the transistor TR9 and the transistor TR10 may have different widths. Accordingly, a width of the transistor TR9 and a width of the transistor TR01 may be selected according to the code TC.

The current source CS3 may output the reference current Iref2. A sum of the magnitude of the current I31 flowing through the transistor TR7 and the magnitude of the current I32 flowing through the transistor TR8 may correspond to the magnitude of the reference current Iref2. In embodiments where characteristics of the transistor TR7 and the transistor TR8 are substantially identical to each other, the magnitude of the current I31 may be substantially identical to the magnitude of the current I32.

For better understanding, in the specification, embodiments in which the magnitude of the current I31 is substantially identical to the magnitude of the current I32 may be described. However, it may be understood that the inventive concepts may include some embodiments in which the currents I31 and I32 have different magnitudes depending on the magnitude of the reference voltage Vref, the magnitude of the feedback voltage Vfb, and characteristics of the transistors TR7 and TR8.

The current source CS4 may output the compensation current ITC2 having a magnitude that is selected by the code TC2. A sum of the magnitude of the current I41 flowing through the transistor TR9 and the magnitude of the current I42 flowing through the transistor TR10 may correspond to the magnitude of the compensation current ITC2. In embodiments where characteristics of the transistor TR9 and the transistor TR10 are substantially identical to each other, the magnitude of the current I41 may be substantially identical to the magnitude of the current I42. The magnitude of the compensation current ITC2 may be selected based on the code TC. Accordingly, the magnitude of the compensation current I41 may be selected based on the code TC.

For better understanding, in the specification, embodiments in which the magnitude of the current I41 is substantially identical to the magnitude of the current I42 may be described. However, it may be understood that the inventive concepts may include some embodiments in which the currents I41 and I42 have different magnitudes depending on the magnitude of the voltage Vntc, the magnitude of the voltage Vztc, and characteristics of transistors (TR9 and TR10) selected by the code TC.

The reference current generating circuit 1120 of FIG. 3 may output the reference current Iref1 having a magnitude that varies with the code TC1 and a temperature, but the reference current generating circuit 2120 of FIG. 6 may output the reference current Iref2 of a fixed value. The compensation circuit 2100a may adjust the magnitude of the voltage Vout2 depending primarily on an operation of the compensation current generating circuit 2131, which varies due to the code TC and a temperature.

Referring together to FIGS. 5 and 6, the magnitude of the current I3 of FIG. 5 may correspond to a sum of the magnitude of the current I31 and the magnitude of the current I32. The magnitude of the current I4 of FIG. 5 may correspond to a sum of the magnitude of the current I41 and the magnitude of the current I42. As the current I3 and the current I4 flow, the voltage Vout2 may be formed at the node N3. As described with reference to FIG. 4, the feedback voltage Vfb may be formed at the node between the resistor R1 and resistor R2, and the read voltage Vread2 may be output from the read voltage generating circuit 2000. The magnitude of the feedback voltage Vfb may be expressed by Equation 3.

$$Vfb = Vref + \alpha*(Vntc - Vztc) \qquad \text{[Equation 3]}$$

In Equation 3, "Vfb" may represent the magnitude of the feedback voltage Vfb, "Vref" may represent the magnitude of the reference voltage Vref, "Vntc" may represent the magnitude of the voltage Vntc, and "Vztc" may represent the magnitude of the voltage Vztc. As described with reference to FIG. 1, the magnitude of the voltage Vntc and/or the magnitude of the voltage Vztc may be associated with a temperature. For example, the magnitude of the voltage Vntc may be configured to have a value proportional to a temperature, and the magnitude of the voltage Vztc may be configured to have a uniform value regardless of a change in temperature. The magnitude "Vfb" of the feedback voltage Vfb may be determined based on a difference between the magnitude of the voltage Vntc and the magnitude of the voltage Vztc. "$\alpha$" in Equation 3 may be expressed by Equation 4.

$$\alpha = k * \sqrt{\frac{W\_9 * I41}{W\_8 * I32}} \qquad \text{[Equation 4]}$$

In Equation 4, "W_8" may represent a width of the transistor TR8, "I32" may represent the magnitude of the current I32, "W_9" may represent a width of the transistor TR9, "I41" may represent the magnitude of the current I41, "k" may be a proportional constant which is independent of a temperature and a value of the code TC.

Referring to Equation 3 and Equation 4, the magnitude of the feedback voltage Vfb may include a non-linear term with respect to both the code TC and temperature caused by "$\alpha$". That is, due to the term $$\text{``} \sqrt{\frac{W\_9 * I41}{W\_8 * I32}} \text{,''}$$

included in "α", the magnitude of the feedback voltage Vfb may include a value which non-linearly varies with a temperature and a value of the code TC.

In detail, since the currents I41 and I32 are drain currents of the transistors TR9 and TR8, respectively, the magnitude of the current I41 and the magnitude of the current I32 may vary with a temperature. According to the relation described with reference to Equation 3 and Equation 4, a rate of change in feedback voltage Vfb to a temperature $$"\frac{\delta Vfb}{\delta T}"$$

may be calculated as $$"C*\left(\frac{\delta}{\delta T}\right)\left(\frac{Vgs9-Vt}{Vgs8-Vt}\right)+\alpha*\frac{\delta}{\delta T}(Vnct-Vztc)".$$

"Vntc−Vztc" may be linear with regard to temperature but $$"\left(\frac{Vgs9-Vt}{Vgs8-Vt}\right)"$$

may not be linear with regard to temperature.
Since, $$"\sqrt{\frac{W\_9*I41}{W\_8*I32}}"$$

corresponds to the square root of a value that may vary with a temperature, $$"\sqrt{\frac{W\_9*I41}{W\_8*I32}}"$$

may be a non-linear term for a change in temperature. Accordingly, the magnitude of the feedback voltage Vfb that is calculated according to Equation 3 and Equation 4 may include a non-linear term for a change in temperature.

Also, as described with reference to the transistors TR9 and TR10, "W_9" and "I41" may vary with a value of the code TC. Since the $$"\sqrt{\frac{W\_9*I41}{W\_8*I32}}"$$

term is the square root of a value that may vary with a value of the code TC, $$"\sqrt{\frac{W\_9*I41}{W\_8*I32}}"$$

may be a non-linear term for a value of the code TC. Accordingly, the magnitude of the feedback voltage Vfb that is calculated according to Equation 3 and Equation 4 may include a non-linear term with regard to a value of the code TC.

As described with reference with FIG. 4, the magnitude of the read voltage Vread2 may correspond to the magnitude of the feedback voltage Vfb. Accordingly, the magnitude of the read voltage Vread2 may vary based on Equation 3. Hereinafter, the read voltage Vread2 may be described with reference to Equation 3 and Equation 4.

In embodiments where the magnitude of the feedback voltage Vfb is non-linear to a temperature and a value of the code TC, the computational burden of the logic circuit may be increased to calculate the read voltage Vread2 having a magnitude that is useful to accurately read data of a memory cell. A logic circuit that is configured to process a lot of operations may consume a lot of power. Also, the logic circuit that is configured to process a lot of operations may be implemented with a chip which is placed in a wide area.

According to the inventive concepts, "W_9" and "I41" may be varied with the code TC in an operation of the compensation circuit 2100a such that the magnitude of the feedback voltage Vfb calculated according to Equation 3 and Equation 4 does not include a non-linear term with regard to a change in temperature and a value of the code TC (e.g., $$"\sqrt{\frac{W\_9*I41}{W\_8*I32}}"$$

may have a value independent of a temperature and a value of the code TC). For example, "W_9" and "I41" may be set to multiples of "W_8" and "I32" respectively, thereby improving a linearity of temperature compensation.

Examples of "W_9" and "I41" that are variously selected according to the code TC will be described with reference to FIGS. 8 to 11.

Figure 7:
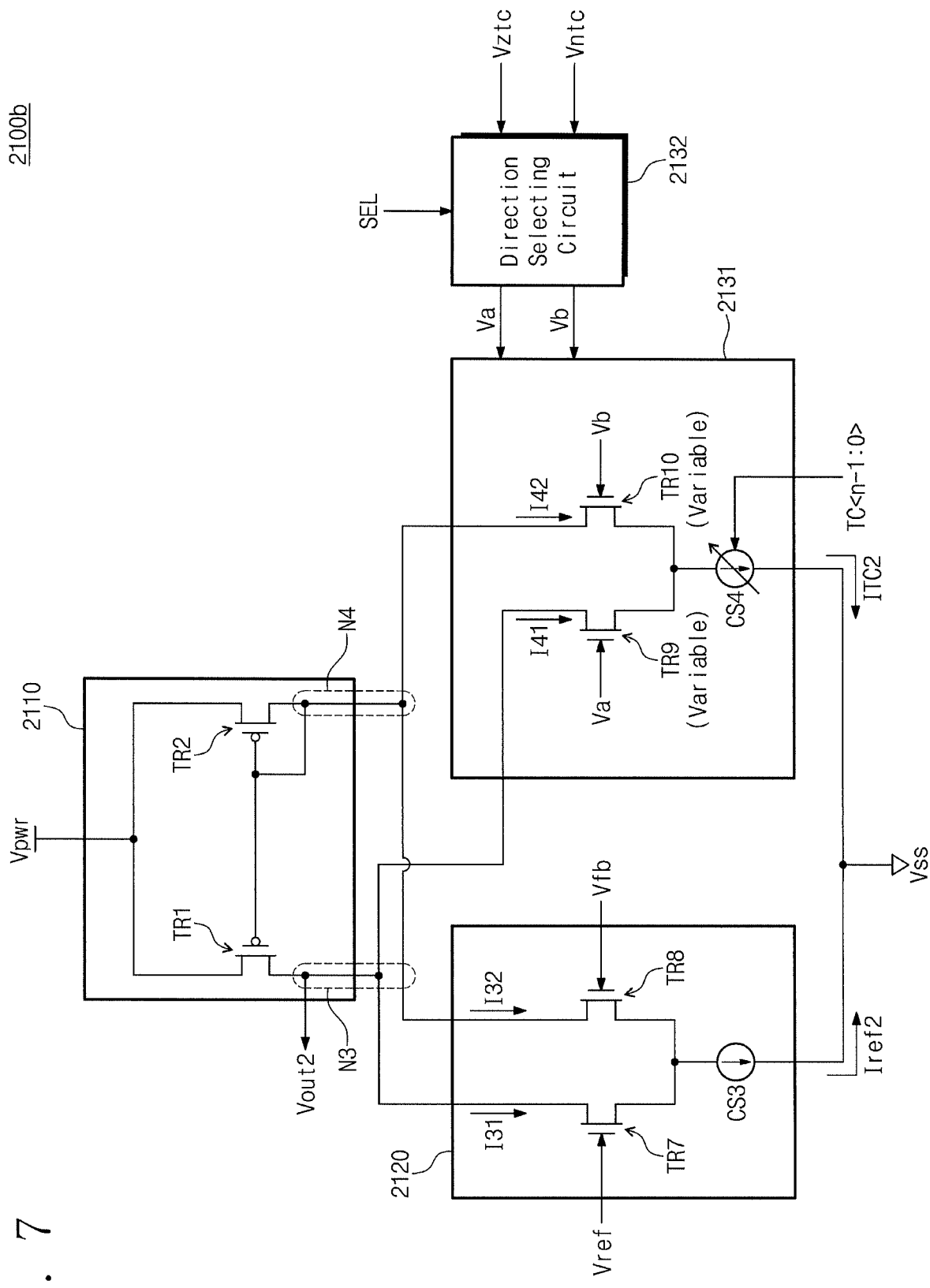
FIG. 7 is a circuit diagram illustrating an example configuration of the compensation circuit of FIG. 4 according to some embodiments of the inventive concepts.

FIG. 7 is a circuit diagram illustrating an example configuration of the compensation circuit of FIG. 4 according to some embodiments of the inventive concepts.

The compensation circuit 2100 of FIG. 4 may include a compensation circuit 2100b of FIG. 7. Compared with the compensation circuit 2100a of FIG. 6, the compensation circuit 2100b of FIG. 7 may further include a direction selecting circuit 2132. Some elements of the read compensation circuit 2100b of FIG. 7 may be the same as or similar to corresponding elements of the compensation circuit 2100a of FIG. 6 described with respect to FIG. 6 and redundant descriptions may be omitted for brevity.

The direction selecting circuit 2132 may receive the voltage Vztc and the voltage Vntc. The direction selecting circuit 2132 may receive a selection signal SEL from the logic circuit. The direction selecting circuit 2132 may output a voltage Va and a voltage Vb in response to the selection signal SEL. The direction selecting circuit 2132 may output the voltage Va to the gate terminal of the transistor TR9. The direction selecting circuit 2132 may output the voltage Vb to the gate terminal of the transistor TR10.

The direction selecting circuit 2132 may output the voltage Va and the voltage Vb, each of which selectively has one of values corresponding to the voltage Vztc and the voltage Vntc based on a logical value of the selection signal SEL. For example, in some embodiments when the selection signal SEL indicates a logical value of "1", the voltage Va may correspond to the voltage Vztc, and the voltage Vb may correspond to the voltage Vntc and when the selection signal SEL indicates a logical value of "0", the voltage Va may correspond to the voltage Vntc, and the voltage Vb may correspond to the voltage Vztc. However, embodiments of the inventive concepts are not limited thereto.

Below, for convenience of description, embodiments in which, in response to the selection signal SEL having a logical value of "1", the voltage Vztc is applied to the gate terminal of the transistor TR9 (i.e., the voltage Vztc is selected as the voltage Va) and the voltage Vntc is applied to the gate terminal of the transistor TR10 (i.e., the voltage Vntc is selected as the voltage Vb) and in which, in response to the selection signal SEL having a logical value of "0", the voltage Vntc is applied to the gate terminal of the transistor TR9 (i.e., the voltage Vntc is selected as the voltage Va) and the voltage Vztc is applied to the gate terminal of the transistor TR10 (i.e., the voltage Vztc is selected as the voltage Vb) will be described.

However, it may be understood that the inventive concepts may include other embodiments in which, in response to any logical value of the selection signal SEL, one of a voltage having a magnitude corresponding to the magnitude of the voltage Vntc and a voltage having a magnitude corresponding to the magnitude of the voltage Vztc is applied to the gate terminal of the transistor TR9, and the other thereof is applied to the gate terminal of the transistor TR10.

As the magnitude of the voltage Vout2 may vary as the voltage Va and the voltage Vb are selected by the selection signal SEL, and magnitudes of the feedback voltage Vfb and the read voltage Vread2 may vary as the voltage Va and the voltage Vb are selected by the selection signal SEL. A relationship between the selection signal SEL and the read voltage Vread2 will be described with reference to FIG. 13.

Figure 8:
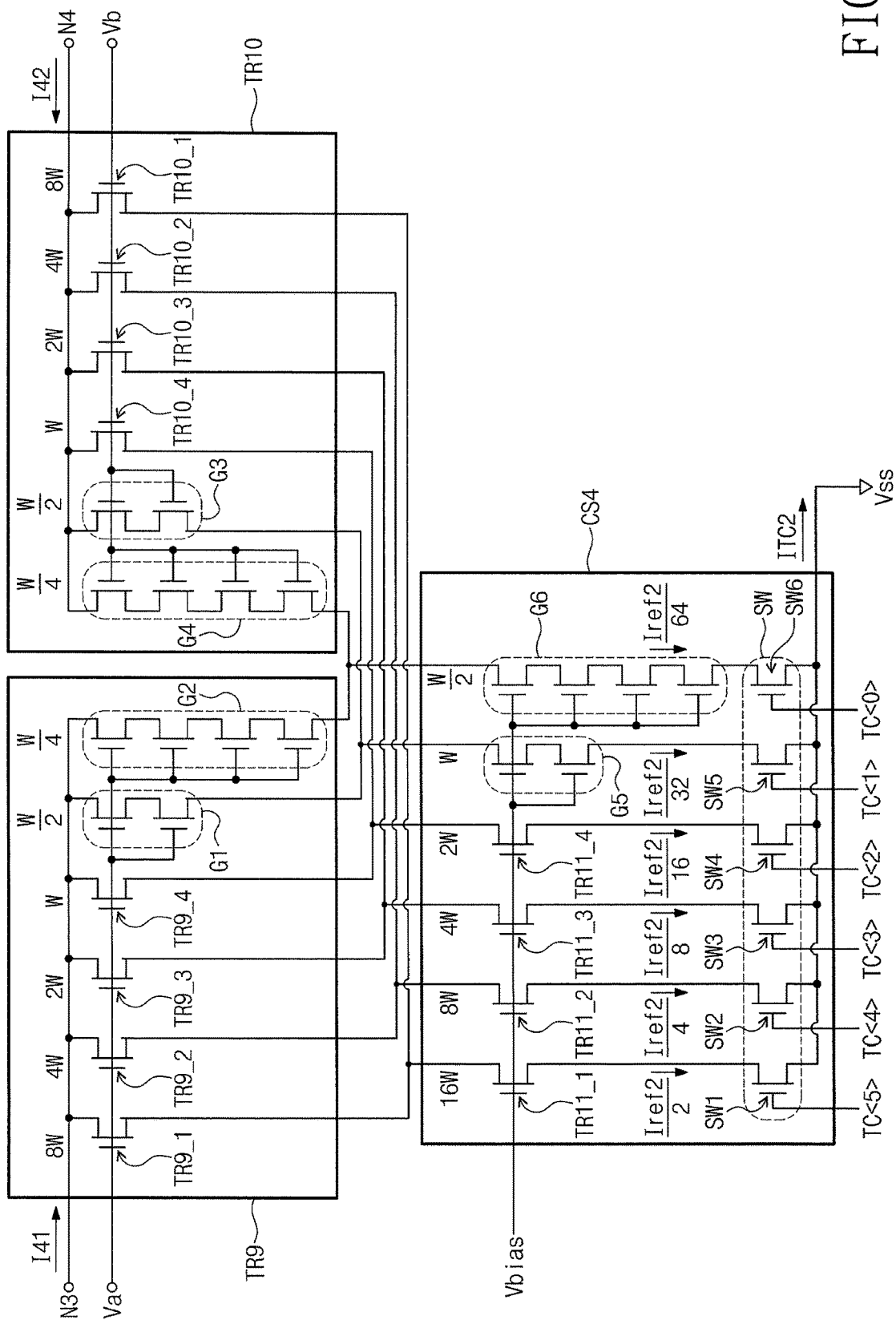
FIG. 8 is a circuit diagram illustrating an example configuration of the compensation current generating circuit of FIG. 7 according to some embodiments of the inventive concepts.

FIG. 8 is a circuit diagram illustrating an example configuration of the compensation current generating circuit of FIGS. 6 and/or 7 according to some embodiments of the inventive concepts. FIG. 8 illustrates a transistor TR9 receiving a voltage Va and a transistor TR10 receiving a voltage Vb (an example corresponding to FIG. 7). For example, the transistor TR9 may receive a voltage Vntc and the transistor TR10 may receive a voltage Vztc in response to "0" of a selection signal SEL.

Referring to FIG. 8, the transistor TR9 of FIGS. 6 and/or 7 may be at least one enabled transistor selected from a plurality of transistors (transistors of a group corresponding to a reference numeral "TR9"). The transistor TR10 of FIGS. 6 and/or 7 may be at least one enabled transistor selected from a plurality of transistors (transistors of a group corresponding to a reference numeral "TR10"). For example, the transistor TR9 may be an enabled one or more of transistors TR9_1 to TR9_4, transistors of a group G1, and transistors of a group G2. The transistor TR10 may be an enabled one or more of transistors TR10_1 to TR10_4, transistors of a group G3, and transistors of a group G4.

Widths of transistors which may be selected as the transistor TR9 may be different. For example, a width of the transistor TR9_1 may be "8 W", a width of the transistor TR9_2 may be "4 W", a width of the transistor TR9_3 may be "2 W", and a width of the transistor TR9_4 may be "W". A width of each of the transistors in the groups G1 and G2 may be "W". In other words, the width of the transistor TR9_1 may be about eight times the width "W", the width of the transistor TR9_2 may be about four times the width "W", and the width of the transistor TR9_3 may be about two times the width "W". In embodiments where the serially connected transistors of the group G1 are selected together, the transistors of the group G1 may operate together. In embodiments where the serially connected transistors of the group G2 are selected together, the transistors of the group G2 may operate together.

In embodiments where transistors are serially connected, a length of a channel through which a current flows may increase, and thus, a ratio of a channel width to a channel length may decrease. Accordingly, the serially connected transistors may operate like a transistor, the width of which is narrower than a width of each transistor. For example, the serially connected transistors may operate like a transistor, the width of which is inversely proportional to the number of serially connected transistors. Accordingly, in embodiments where the serially connected transistors of the group G1 operate together, an operation of two transistors in the group G1 may be similar to an operation of a transistor having a width of "(½)*W", or about half of the width "W". As in the above description, an operation of four transistors in the group G2 may be similar to an operation of a transistor having a width of "(¼)*W", or about one fourth of the width "W".

In the embodiments of FIG. 8, transistors which may be selected for the transistor TR9 may operate as transistors having widths of "(¼)*W", "(½)*W", "W", "2 W", "4 W", and "8 W". That is, transistors which may be selected for the transistor TR9 may operate as transistors having widths of "($2^i$)*W" (i being an integer $-2 \geq i \geq 3$). In embodiments where each of the transistors TR7 and TR8 of the current source CS3 have a width "W", widths of transistors which may be selected as the transistor TR9 may be proportional to widths of the transistors TR7 and TR8, respectively. While some embodiments with values of I within a range of "$-2 \leq i \leq 3$" may be described with reference to FIG. 8, it is understood that the inventive concepts may include embodiments for other ranges for the integer "i".

Accordingly, one of various values may be selected as a width "W_9" of the transistor TR9 in Equation 4. In embodiments where a width "W_8" of the transistor TR8 is "W", values which may be selected as "W_9" may be proportional to "W_8". The transistor TR9 may be configured such that values proportional to "W_8" may be selected as "W_9". The transistor TR10 may have a configuration which is similar to the configuration of the transistor TR9. Thus, additional description will be omitted to avoid redundancy.

In the embodiments of FIG. 8, the code TC may be expressed by 6-bit data (i.e., each of TC<0> to TC<5> may be expressed by 1-bit data). TC<0> to TC<5> may respectively indicate values of "$2^0$" to "$2^5$" positions of the 6-bit data. For example, in some embodiments, when the code TC is expressed by "100010", "TC<1>" and "TC<5>" may be "1", "TC<0>", "TC<2>", "TC<3>", and "TC<4>" may be "0".

Referring to FIG. 8, the current source CS4 may include a switch unit SW. The switch unit SW may include switches SW1 to SW6. The switches SW1 to SW6 may receive corresponding bits of the code TC including TC<5> to TC<0>. Each of TC<0> to TC<5> may be a logical value of "0" or a logical value of "1". Each of the switches SW1 to SW6 may be turned on in response to a logical value of "1" and may be turned off in response to a logical value of "0" of a corresponding bit of the code TC. For example, the logical value of "1" and the logical value of "0" of TC<0> to TC<5> may correspond to specific magnitudes of voltages, respectively.

For example, in some embodiments, when the code TC is expressed by "100010" (i.e., when TC<1> and TC<5> are "1" and TC<0>, TC<2>, TC<3>, and TC<4> are "0"), the switch SW1 and the switch SW5 may be turned on, and the switch SW2, the switch SW3, the switch SW4, and the switch SW6 may be turned off.

When a specific switch of the switches SW1 to SW6 is turned on, a current may flow through the specific switch, and bias transistors in the current source CS4 and differential pairs in the transistor TR9 and the transistor TR10 connected to the specific switch. For example, in some embodiments, when the switch SW1 is turned on, a current may flow through a transistor TR11_1 connected to the switch SW1. For example, in some embodiments when the switch SW5 is turned on, a current may flow through transistors of a group G5 and differential pairs in the transistor TR9 and the transistor TR10 connected to the switch SW5.

The current source CS4 may be a current mirror circuit corresponding to a replica of the current source CS3. A voltage Vbias may be a bias voltage supplied in common to the current source CS3 and the current source CS4. Accordingly, in some embodiments when the switches SW1 to SW6 are turned on, a mirrored current obtained by mirroring the reference current Iref2 may flow through bias transistors TR11_1 to TR11_4, transistors of the group G5, and transistors of a group G6, which are connected to the switches SW1 to SW6. In detail, the magnitude of the current flowing through the current source CS4 may be proportional to the magnitude of the reference current Iref2.

Also, as a width of a transistor becomes larger, the magnitude of a current flowing through the transistor may become greater. For example, the magnitude of the current flowing through the transistor may be proportional to a width of the transistor. Widths of the bias transistors TR11_1 to TR11_4 may be "16 W", "8 W", "4 W", and "2 W", respectively. Each of the transistors in the group G5 and the group G6 may be "2 W". As described with reference to transistors of the groups G1 to G4, the serially connected transistors of the group G5 may operate as a transistor having a width of "W". The serially connected transistors of the group G6 may operate as a single transistor having a width of "(½)*W".

For example, in some embodiments when only the switch SW1 is turned on (in some embodiments when only TC<5> is "1" and TC<0> to TC<4> are "0"), a current having a magnitude of "(Iref2)/2" may flow through the transistor TR11_1 having a width of "16 W". As in the above description, a current having a magnitude of "(Iref2)/4" may flow through the transistor TR11_2, a current having a magnitude of "(Iref2)/8" may flow through the transistor TR11_3, a current having a magnitude of "(Iref2)/16" may flow through the transistor TR11_4, a current having a magnitude of "(Iref2)/32" may flow through the transistors of the group G5, and a current having a magnitude of "(Iref2)/64" may flow through the transistors of the group G6. That is, a current having a magnitude of "$(2^j)*(Iref2)$" may flow through the transistors TR11_1 to TR11_4, the transistors of the group G5, and the transistors of the group G6 (j being an integer, $-6 \geq j \geq -1$). An example range of "$-6 \leq j \leq -1$" is described with reference to FIG. 8, however, it is understood that the inventive may include embodiments for other ranges of the integer "j".

In some embodiments when only one of the switches SW1 to SW6 is turned on, the magnitude of the current flowing through a current source CS may be one of "(Iref2)/2", "(Iref2)/4", "(Iref2)/8", "(Iref2)/16", "(Iref2)/32", and "(Iref2)/64". In some embodiments when two or more of the switches SW1 to SW6 are turned on, the magnitude of the current flowing through a current source CS may correspond to a sum of the magnitudes of currents, which flow through turned-on switches, from among "(Iref2)/2", "(Iref2)/4", "(Iref2)/8", "(Iref2)/16", "(Iref2)/32", and "(Iref2)/64". Accordingly, the magnitude of the current flowing through the current source CS4 may correspond to a sum of numbers expressed by "$(2^j)*(Iref2)$". That is, the magnitude of the current flowing through the current source CS4 may be selected to be proportional to the magnitude of the reference current Iref2 depending on the code TC.

The compensation current ITC2 may be output as a current flows through the switch unit SW. Accordingly, the magnitude of the compensation current ITC2 may correspond to the magnitude of the current flowing through the current source CS4 (e.g., the magnitudes may be substantially identical to each other). This may mean that the magnitude of the compensation current ITC2 is selected to be proportional to the magnitude of the reference current Iref2.

For example, in some embodiments when the code TC has a reference value, the compensation current ITC2 which has the smallest magnitude (e.g., a reference current magnitude: for example, $2^{-6}*(Iref2)$) of magnitudes which may be selected may be output. Accordingly, in some embodiments when a value of the code TC is increased by the reference value, the magnitude of the compensation current ITC2 may be increased by the reference current magnitude.

For example, in some embodiments when the reference value of the code TC is "000001", whenever a value of the code TC is increased by "000001", the magnitude of the compensation current ITC2 may be increased by "(Iref2)/64" which may be the magnitude of a current flowing through the switch SW6 and transistors of the group G6. For example, the magnitude of the compensation current ITC2 selected by the code TC having the value of "000100" is "(Iref2)/16", and the magnitude of the compensation current ITC2 selected by the code TC having the value of "000101" is "(Iref2)/64+(Iref2)/16".

As described with reference to FIG. 6, in embodiments where characteristics of the transistor TR9 and the transistor TR10 selected by the code TC are substantially identical to each other, the magnitude of the current I41 may be substantially identical to the magnitude of the current I42. Accordingly, the magnitude of the current flowing through the current source CS4 may be proportional to the magnitude of the reference current I41. Also, in embodiments where characteristics of the transistor TR7 and the transistor TR8 are substantially identical to each other, the magnitude of the current I31 may be substantially identical to the magnitude of the current I32. Accordingly, the magnitude of the current I32 of FIG. 6 may be proportional to the magnitude of the reference current Iref2.

The magnitude of the current I32 may be proportional to the magnitude of the reference current Iref2, and the magnitude of the current I41 may also be proportional to the reference current Iref2. According to the above description, in Equation 3 and Equation 4, "I41" may have a value proportional to "I32". The compensation current generating circuit 2131 may be configured to output the current I41 having a magnitude proportional to the magnitude of the current I32, based on the process described with reference to the operation of the current source CS4.

In Equation 3 and Equation 4, in embodiments where "W_9" has a value proportional to "W_8" and "I41" has a value proportional to "I32", $$"\sqrt{\frac{W\_9 * I41}{W\_8 * I32}}"$$

may have a value independent of a temperature and a value of the code TC. Accordingly, the magnitude of the feedback voltage Vfb calculated according to Equation 3 and Equation 4 may be linear to a temperature and a value of the code TC. As a magnitude of the read voltage Vread2 corresponds to the magnitude of the feedback voltage Vfb, the magnitude of the read voltage Vread2 may be linear to a temperature and a value of the code TC. For example, the magnitude of the read voltage Vread2 may have a reference voltage value in response to the code TC of the reference value. Also, whenever a value of the code TC is increased by the reference magnitude, the magnitude of the read voltage Vread2 may be increased by the reference voltage magnitude.

The read voltage generating circuit 2000 may be configured to output the read voltage Vread2 of a magnitude linear to a temperature and a value of the code TC. As a magnitude of the read voltage Vread2 may correspond to the magnitude of the feedback voltage Vfb, the read voltage generating circuit 2000 may be configured to output the read voltage Vread2 including a magnitude that is linear to the temperature and the value of the code TC. Some embodiments in which the transistor TR9 and the transistor TR10 are selected by the code TC will be described with reference to FIGS. 9 to 11.

Figure 9:
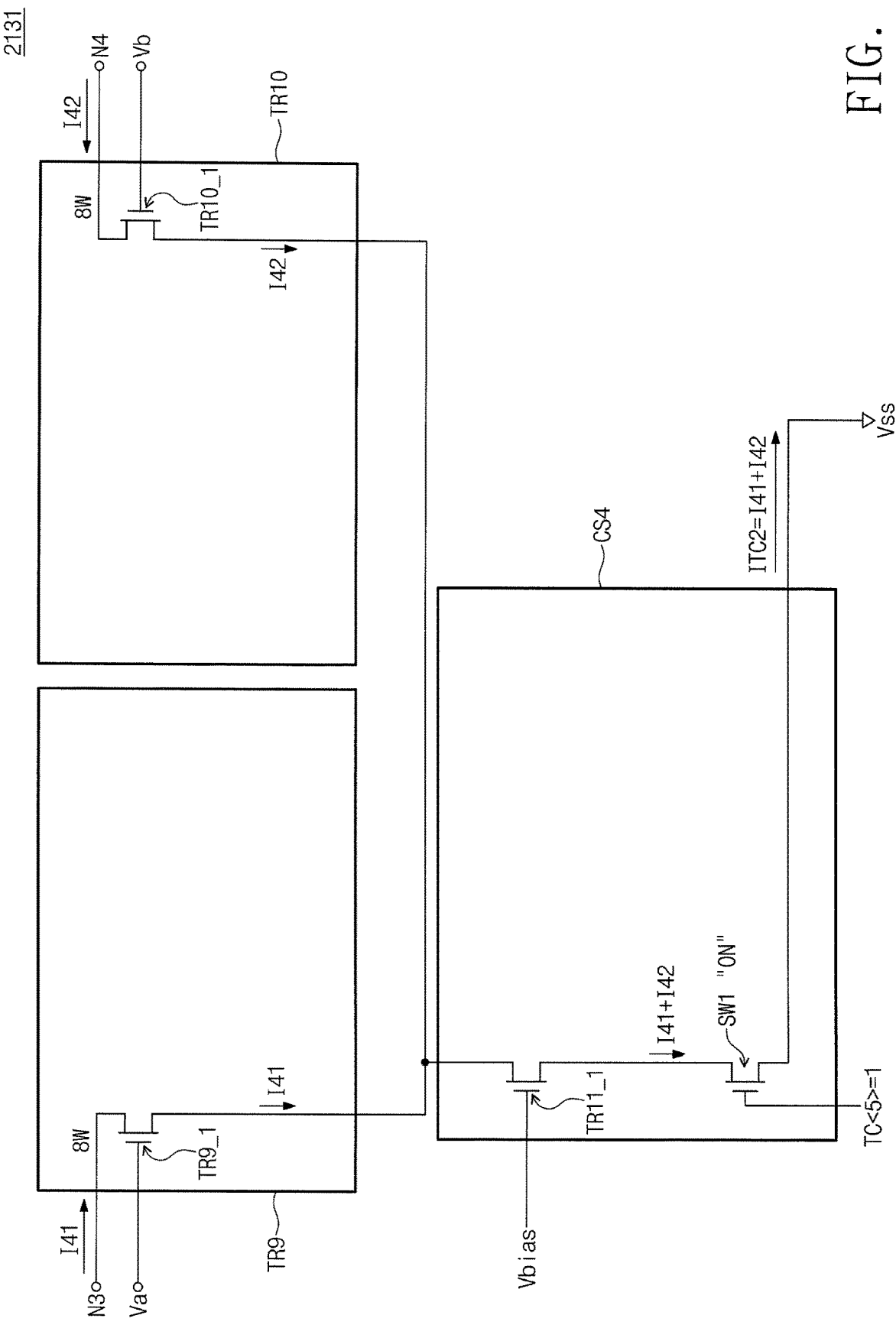
FIG. 9 is a circuit diagram for describing an example operation of the compensation current generating circuit of FIG. 8 according to some embodiments of the inventive concepts.

FIG. 9 is a circuit diagram for describing an example operation of the compensation current generating circuit of FIG. 8 according to some embodiments of the inventive concepts. In the operation illustrated in FIG. 9, one transistor TR9_1 may be selected as the transistor TR9, and one transistor TR10_1 may be selected as the transistor TR10.

For example, the switch unit SW of the current source CS4 may receive the code TC having "100000" from the logic circuit (i.e., only a code value TC<5> is "1", and the remaining values are "0"). As the switch SW1 is turned on in response to the logical value of "1", a current of "(Iref2)/2" may flow through the transistor TR11_1.

As the current of "I41+I42" flows through the transistor TR11_1, a current I41 may flow through the transistor TR9_1 and a current I42 may flow through the transistor TR01_1 electrically connected to the transistor TR11_1. As the current of I41 and the current I42 flow through the transistors TR9_1 and TR10_1 respectively, the current I41 and the current I42 may be respectively input to the transistor TR9 and the transistor TR10. In embodiments where the transistor TR7 and the transistor TR8 of the reference current generating circuit 2120 are symmetrical to each other, the magnitude of the current I32 may be "I41+I42".

Accordingly, based on the code TC of "100000", the magnitude of a magnitude of the current I41 and the current I42 may be selected as a specific value, the transistor TR9_1 may be selected as the transistor TR9, and the transistor TR10_1 may be selected as the transistor TR10.

Figure 10:
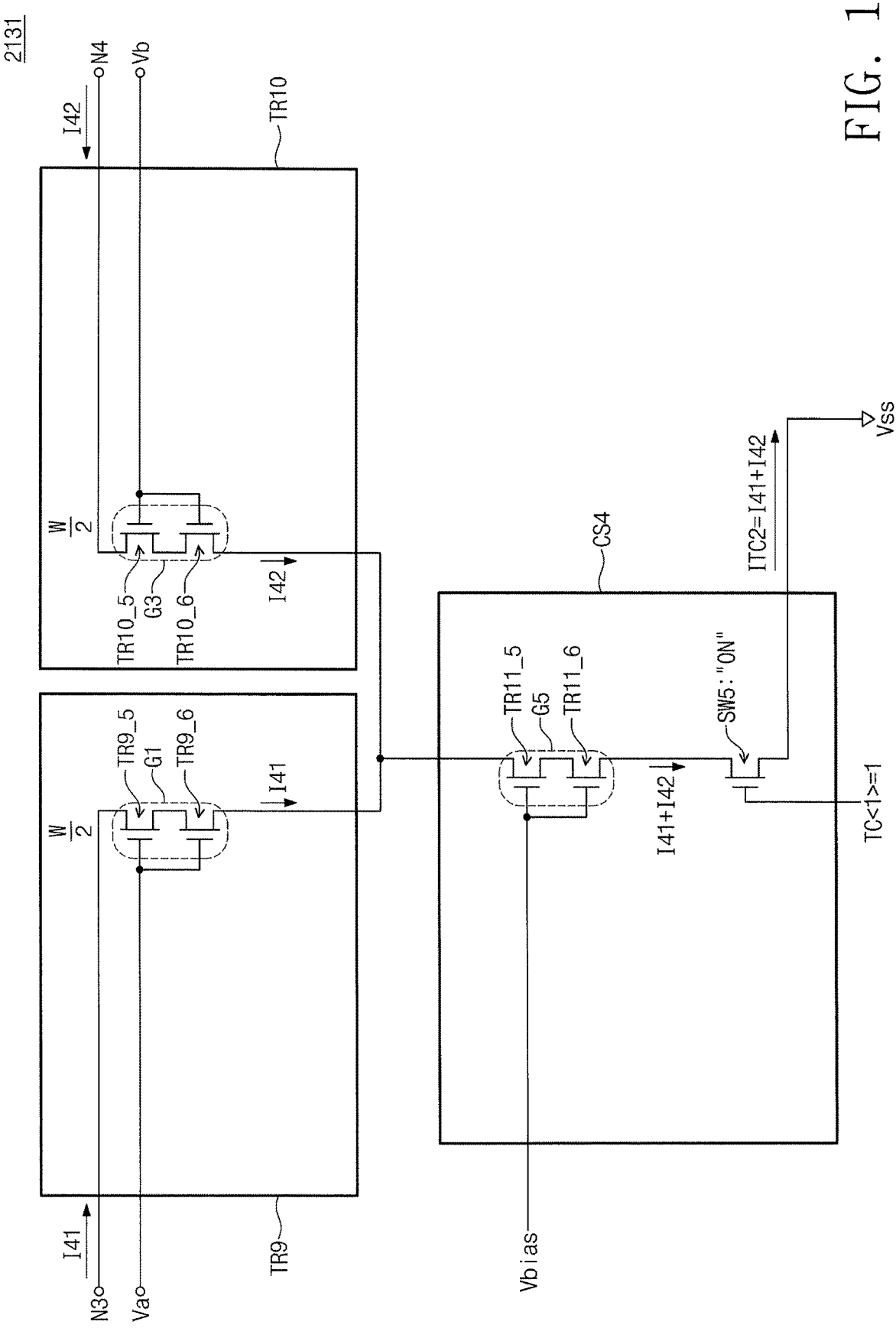
FIG. 10 is a circuit diagram for describing an example operation of the compensation current generating circuit of FIG. 8 according to some embodiments of the inventive concepts.

FIG. 10 is a circuit diagram for describing an example operation of the compensation current generating circuit of FIG. 8 according to some embodiments of the inventive concepts. In the operation illustrated in FIG. 10, two or more transistors TR9_5 and TR9_6 may be selected as the transistor TR9, and two or more transistors TR10_5 and TR10_6 may be selected as the transistor TRI0.

For example, the switch unit SW of the current source CS4 may receive the code TC having "000010" from the logic circuit (i.e., only a code value TC<1> is "1", and the remaining values are "0"). As the switch SW_5 is turned on in response to the logical value of "1", a current of "I41+I42" may flow through transistors TR11_5 and TR11_6 of the group G5.

As the current of "I41+I42" flows through the transistors TR11_5 and TR11_6, a current I41 may flow through transistors TR9_5 and TR9_6 of the group G1 electrically connected to the transistor TR11_5 and a current I42 may flow through transistors TR10_5 and TR10_6 of the group G3 electrically connected to the transistor TR11_5. As the current I41 flows through the transistors TR9_5 and TR9_6 and through transistors TR10_5 and TR10_6, the current I41 and the current I42 may be respectively input to the transistor TR9 and the transistor TR10. In embodiments where the transistor TR7 and the transistor TR8 of the reference current generating circuit 2120 are symmetrical to each other, the magnitude of the current I32 may be "I41+I42".

Accordingly, based on the code TC of "000010", the magnitude of the current I41 and the current I42 may be selected as a specific value, the transistors TR9_5 and TR9_6 of the group G1 may be selected as the transistors TR9, and the transistors TR10_5 and TR10_6 of the group G3 may be selected as the transistor TR10.

Figure 11:
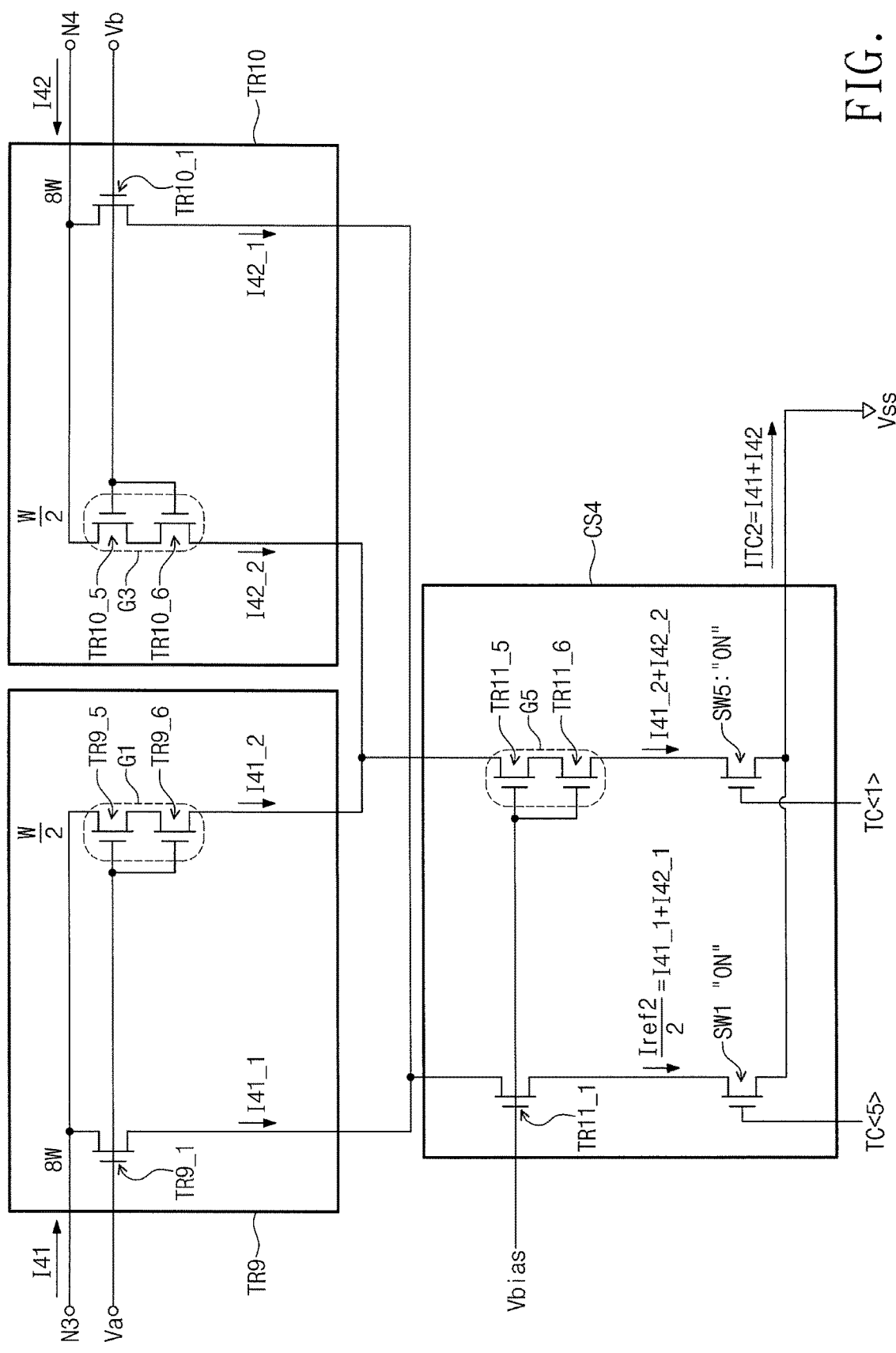
FIG. 11 is a circuit diagram for describing an example operation of the compensation current generating circuit of FIG. 8 according to some embodiments of the inventive concepts.

FIG. 11 is a circuit diagram for describing an example operation of the compensation current generating circuit of FIG. 8 according to some embodiments of the inventive concepts. In the operation illustrated in FIG. 11, the transistor TR9_1 and the transistors TR9_5 and TR9_6 of the group G1 may be selected as the transistor TR9 together. The transistor TR10_1 and the transistors TR10_5 and TR10_6 of the group G3 may be selected as the transistor TR10 together.

In embodiments where transistors are connected in parallel, a current may flow through a channel of a wider width. Accordingly, an operation of the transistors connected in parallel may be similar to an operation of one transistor, the width of which corresponds to a sum of widths of the transistors. In operations where the transistors connected in parallel are selected as the transistor TR9, "W_9" of Equation 4 may correspond to a sum of widths of the selected transistors. For example, in operations where the transistor TR9_1 and the transistors TR9_5 and TR9_6 together operate as the transistor TR9, "W_9" may be "(8+½)*W" which corresponds to a sum of "8 W" and "(½)*W".

In the operation illustrated in FIG. 11, the switch unit SW of the current source CS4 may receive the code TC expressed by "100010" from the logic circuit (i.e., code values TC<1> and TC<5> are "1", and the remaining values are "0"). As the switch SW_5 is turned on in response to the logical value of "1", a current of "I41_2+I42_2" may flow through transistors TR11_5 and TR11_6 of the group G5. As the switch SW_1 is turned on in response to the logical value of "1", a current of "I41_1+I42_1" may flow through the transistor TR11_1.

For example, as the current of "I41_2+I42_2" flows through the transistors TR11_5 and TR11_6, a current I41_2 may flow through the transistors TR9_5 and TR9_6 of the group GI electrically connected to the transistor TR11_5 and a current I42_2 may flow through the transistors TR10_5 and TR10_6 of the group G3 electrically connected to the transistor TR11_5. As the current of "I41_1+I42_1" flows through the transistor TR11_1, a current I41_1 may flow through the transistors TR9_1 and a current I42_1 may flow through the transistor TR10_1.

As currents flow through the transistors TR9_5 and TR9_6, the transistors TR10_5 and TR10_6, the transistor TR9_1, and the transistor TR10_1, the current I41 and the current I42 may be respectively input to the transistor TR9 and the transistor TR10. Also, in embodiments where the transistor TR7 and the transistor TR8 of the reference current generating circuit 2120 are symmetrical to each other, the magnitude of the current I32 may be "I41+I42".

That is, based on the code TC of "100010", the magnitudes of the current I41 and the current I42 may be selected as specific values, the transistors TR9_5 and TR9_6 of the group G1 and the transistor TR9_1 may be selected as the transistor TR9, and the transistors TR10_5 and TR10_6 of the group G3 and the transistor TR01_1 may be selected as the transistor TR10.

As described with reference to FIGS. 9 to 11, in the embodiments of FIG. 8, "W_9" of Equation 4 may selectively have one of "(¼)*W", "(½)*W", "W", "2 W", "4 W", and "8 W" or a sum of two or more of "(¼)*W", "(½)*W", "W", "2 W", "4 W", and "8 W", depending on a value of the code TC. That is, a width "W_9" of the transistor TR9 in Equation 4 may be variously selected to have a value proportional to a width "W" of the transistor TR8.

Also, as described with reference to FIG. 8, depending on a value of the code TC, the magnitude of the compensation current ITC2 may selectively have one of "(Iref2)/2", "(Iref2)/4", "(Iref2)/8", "(Iref2)/16", "(Iref2)/32", and "(Iref2)/64", or a sum of two or more of "(Iref2)/2", "(Iref2)/4", "(Iref2)/8", "(Iref2)/16", "(Iref2)/32", and "(Iref2)/64".

Since the magnitude of the current I41 may be proportional to the magnitude of the compensation current ITC2 (e.g., the magnitude of the current I41 may be ½ times the magnitude of the compensation current ITC2), "I41" may be variously selected to have a value proportional to the magnitude of the reference current Iref2. Since the magnitude of the current I32 may be proportional to the magnitude of the reference current Iref2 (e.g., the magnitude of the current I32 may be ½ times the magnitude of the reference current Iref2), "I32" may be variously selected to have a value proportion to the magnitude of the reference current Iref2. Accordingly, "I41" in Equation 4 may be variously selected to have a value proportional to "I32".

Figure 12:
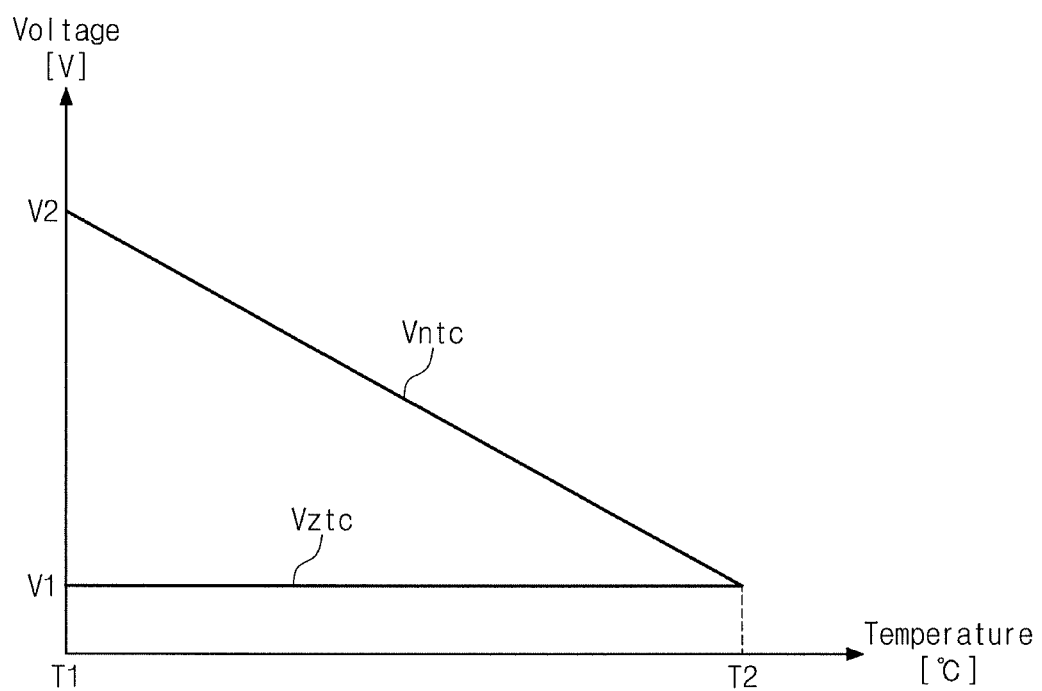
FIG. 12 is a graph illustrating voltages received by a compensation circuit of FIG. 4 according to some embodiments of the inventive concepts.

FIG. 12 is a graph illustrating voltages received by the compensation circuit of FIG. 4 according to some embodiments of the inventive concepts. In the graph of FIG. 12, an x-axis may represent a temperature expressed in terms of a unit oC, and a y-axis may represent a magnitude of a voltage expressed in terms of a unit V. Graphs of FIG. 12 indicate the magnitudes of the voltages Vztc and Vntc varying with a temperature at a specific value of the code TC.

Referring to FIG. 12, the magnitude of the voltage Vntc may be negatively proportional to a temperature. The magnitude of the voltage Vztc may be uniform regardless of a change in temperature. As described with reference to FIG. 1, the voltage Vztc and the voltage Vntc may be received from the voltage generator included in the memory system. For example, the voltage generator may detect a change in temperature of the memory system. The voltage generator may output the voltages Vztc and Vntc of magnitudes corresponding to the detected temperature. For example, in an operation where a temperature is "T1", the voltage generator may output the voltage Vztc of "V1" and the voltage Vntc of "V2". For example, in an operation where a temperature is "T2", the voltage generator may output the voltage Vztc of "V1" and the voltage Vntc of "V1" identical to the magnitude of the voltage Vztc.

Figure 13:
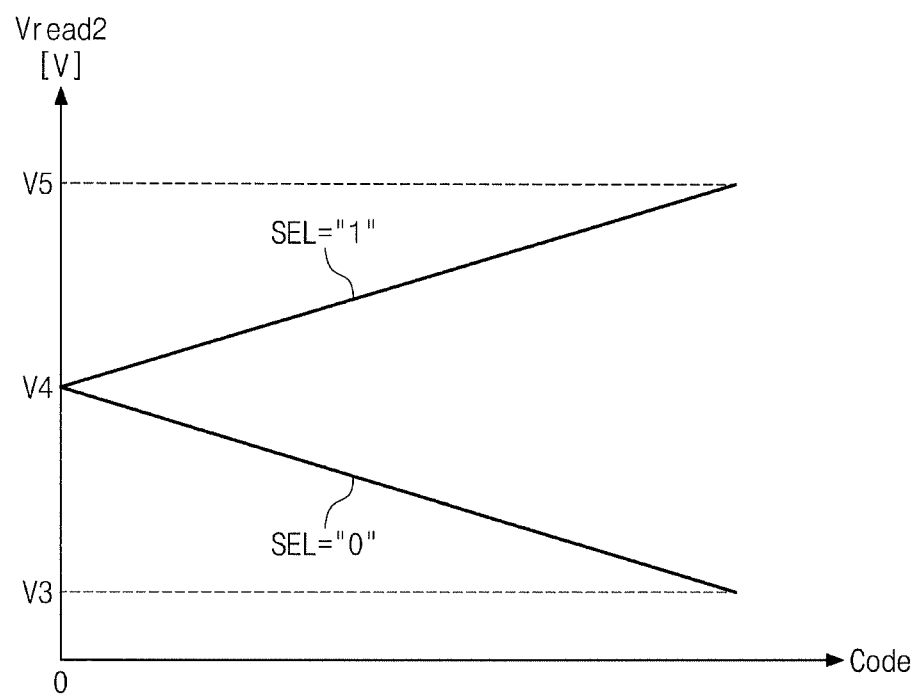
FIG. 13 is a graph illustrating a read voltage of FIG. 4 depending on a selection signal according to some embodiments of the inventive concepts.

FIG. 13 is a graph illustrating the read voltage of FIG. 4 depending on the selection signal according to some embodiments of the inventive concepts. In the graph of FIG. 13, an x-axis may represent a value of the code TC, and a y-axis may represent a magnitude of a read voltage Vread2.

The graph of FIG. 13 is illustrated with regard to continuous values of the code TC, but in some embodiments actual values of the code TC may be discontinuous. However, to easily describe how the magnitude of the read voltage Vread2 varies with a value of the code TC, the graph may be illustrated as being continuous with regard to a value of the code TC.

As described with reference to FIG. 7, in some embodiments when the selection signal SEL has a logical value of "1", the voltage Vztc may be selected as the voltage Va, and the voltage Vntc may be selected as the voltage Vb. Also, when the selection signal SEL has a logical value of "0", the voltage Vntc may be selected as the voltage Va, and the voltage Vztc may be selected as the voltage Vb.

Referring to Equation 3, the magnitude of the voltage Vout2 in FIG. 7 may be expressed by Equation 5.

$$Vfb = Vref + \alpha*(Va-Vb) \quad \text{[Equation 5]}$$

"Vntc" may have a value negatively proportional to a temperature. Also, "Vztc" may have a uniform value regardless of a temperature. In Equation 5, in operations where "Va" is "Vntc" and "Vb" is "Vztc" (e.g., where a logical value of the selection signal SEL is "0"), "Vfb" may be calculated as a value negatively proportional to a temperature. In Equation 5, in operations where "Va" is "Vztc" and "Vb" is "Vntc" (e.g., where a logical value of the selection signal SEL is "1"), "Vfb" may be calculated as a value positively proportional to a temperature.

As described with reference to FIG. 4, a magnitude of a read voltage Vread2 may correspond to the magnitude of the feedback voltage Vfb and a magnitude of a feedback voltage Vfb may correspond to the magnitude of the voltage Vout2.

As a threshold voltage of a memory cell varies with various conditions, the read voltage Vread2 having a magnitude that varies with the threshold voltage of the memory cell, may be provided to read accurately a data stored in the memory cell. In embodiments where the read voltage Vread2 is desired to have a magnitude that increases according to an increase in a value of the code TC, the logic circuit may output the selection signal SEL having a logical value of "1". In embodiments where the read voltage Vread2 is desired to have a magnitude that decreases according to an increase in a value of the code TC, the logic circuit may output the selection signal SEL having a logical value of "0".

Figure 14:
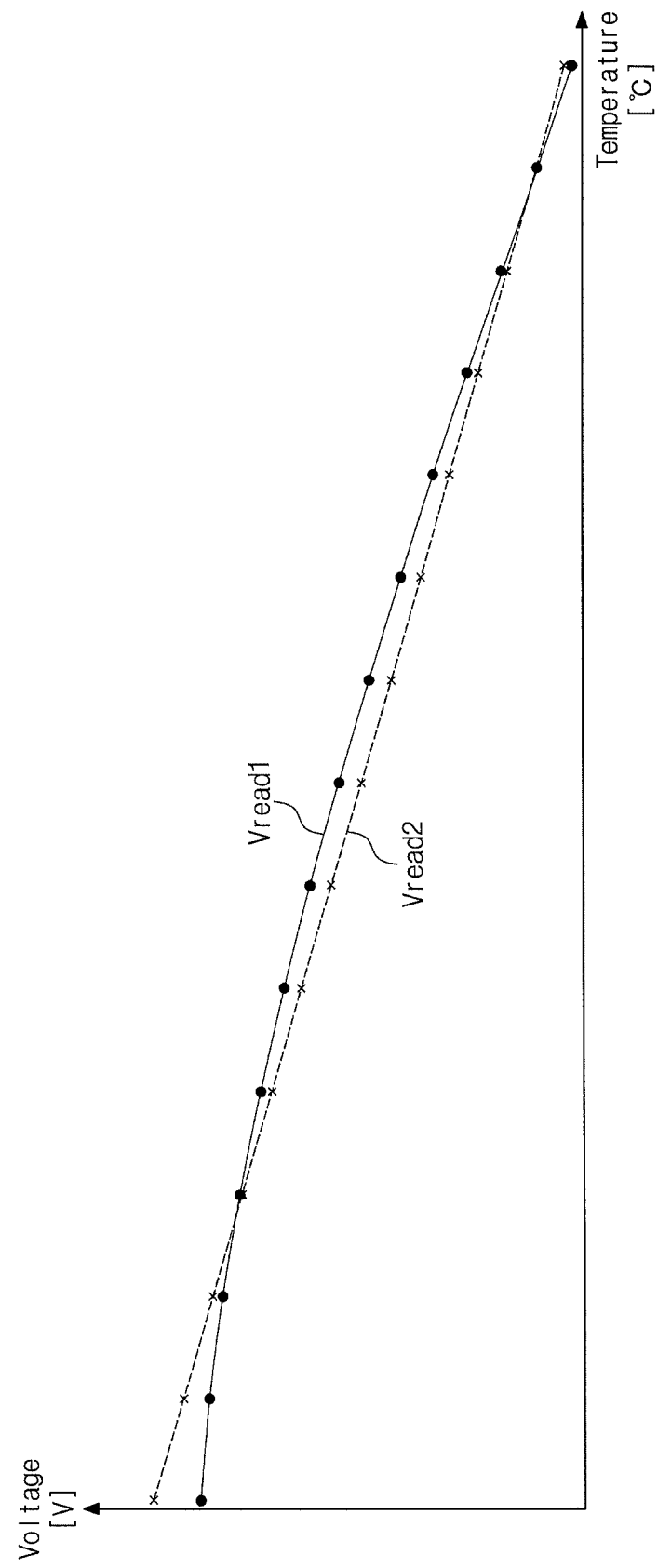
FIG. 14 is a graph illustrating voltages output from the read voltage generating circuits of FIGS. 1 and/or 4 according to some embodiments of the inventive concepts.

FIG. 14 is a graph illustrating voltages output from the read voltage generating circuits of FIGS. 1 and/or 4 according to some embodiments of the inventive concepts. In the graph of FIG. 14, an x-axis may represent a temperature expressed in terms of a unit oC, and a y-axis may represent a magnitude of a voltage expressed in terms of a unit V.

Referring to FIG. 14, the magnitude of the read voltage Vread1 and the magnitude of the read voltage Vread2 may decrease as a temperature increases. On a temperature domain of FIG. 14, a variation of a differential non-linearity (DNL) value of the voltage Vout1 may be greater than a variation of a DNL value of the read voltage Vread2.

The DNL value may be associated with a difference between a magnitude of an ideally linear voltage and a magnitude of an actual voltage on a specific domain. That is, the DNL value may be associated with a linearity of a magnitude of a voltage on a specific domain. In the specification, that the linearity of the voltage is high may refer to the variation of the DNL value of the magnitude of the voltage on a specific domain being small.

As described with reference to FIGS. 4 to 11, since the voltage generating circuit 2000 is configured to output the read voltage Vread2 having a magnitude that is proportional to a temperature, the magnitude of the read voltage Vread2 output from the voltage generating circuit 2000 may have a high linearity on a temperature domain. Referring to FIGS. 1 and 4, on the temperature domain, the linearity of the read voltage Vread2 output from the voltage generating circuit 2000 may be higher than a linearity of the read voltage Vread1 output from the voltage generating circuit 1000.

As described with reference to FIG. 8, "W_9" and "I41" of Equation 4 may be selected to have a value proportional to "W_8" and "I32". Accordingly, "α" of Equation 4 may be calculated as a constant independent of a temperature. However, "α" of Equation 2 may include a square root term (a term non-linear to a temperature). Accordingly, on the temperature domain, the linearity of the read voltage Vread2 may be higher than the linearity of the read voltage Vread1.

Figure 15:
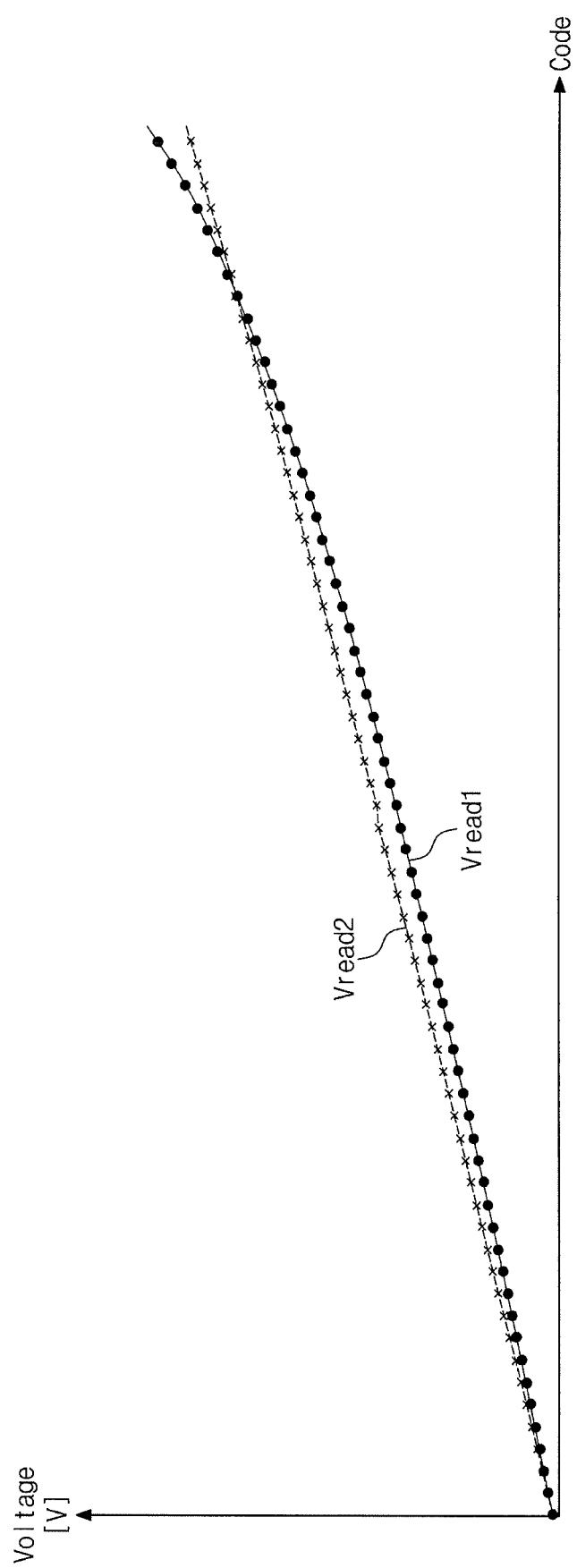
FIG. 15 is a graph illustrating voltages output from read voltage generating circuits of FIGS. 1 and/or 4 according to some embodiments of the inventive concepts.

FIG. 15 is a graph illustrating voltages output from the read voltage generating circuits of FIGS. 1 and/or 4 according to some embodiments of the inventive concepts. In the graph of FIG. 15, an x-axis may represent a value of the code TC, TC1, or TC2, and a y-axis may represent a magnitude of a voltage expressed in terms of a unit V.

Referring to FIG. 15, the magnitude of the read voltage Vread1 and the magnitude of the read voltage Vread2 may increase as a value of the code TC increases. On a code domain, a variation of a DNL value of the read voltage Vread1 may be greater than a variation of a DNL value of the read voltage Vread2.

As described with reference to FIGS. 4 to 11, since the read voltage generating circuit 2000 is configured to output the read voltage Vread2 having a magnitude that is proportional to a value of the code TC, the magnitude of the read voltage Vread2 output from the compensation circuit 2100 may have a high linearity on the code domain. Referring to FIGS. 1 and 4, on the code domain, the linearity of the read voltage Vread2 output from the voltage generating circuit 2000 may be higher than a linearity of the read voltage Vread1 output from the read voltage generating circuit 1000.

As described with reference to FIG. 8, "W_9" and "I41" of Equation 4 may be selected to have a value proportional to "W_8" and "I32". Accordingly, "α" of Equation 4 may be calculated as a constant independent of a value of the code TC. However, "α" of Equation 2 may include a square root term (a term non-linear to the codes TC1, and TC2). Accordingly, on the code domain, the linearity of the read voltage Vread2 may be higher than the linearity of the read voltage Vread1.

Figure 16:
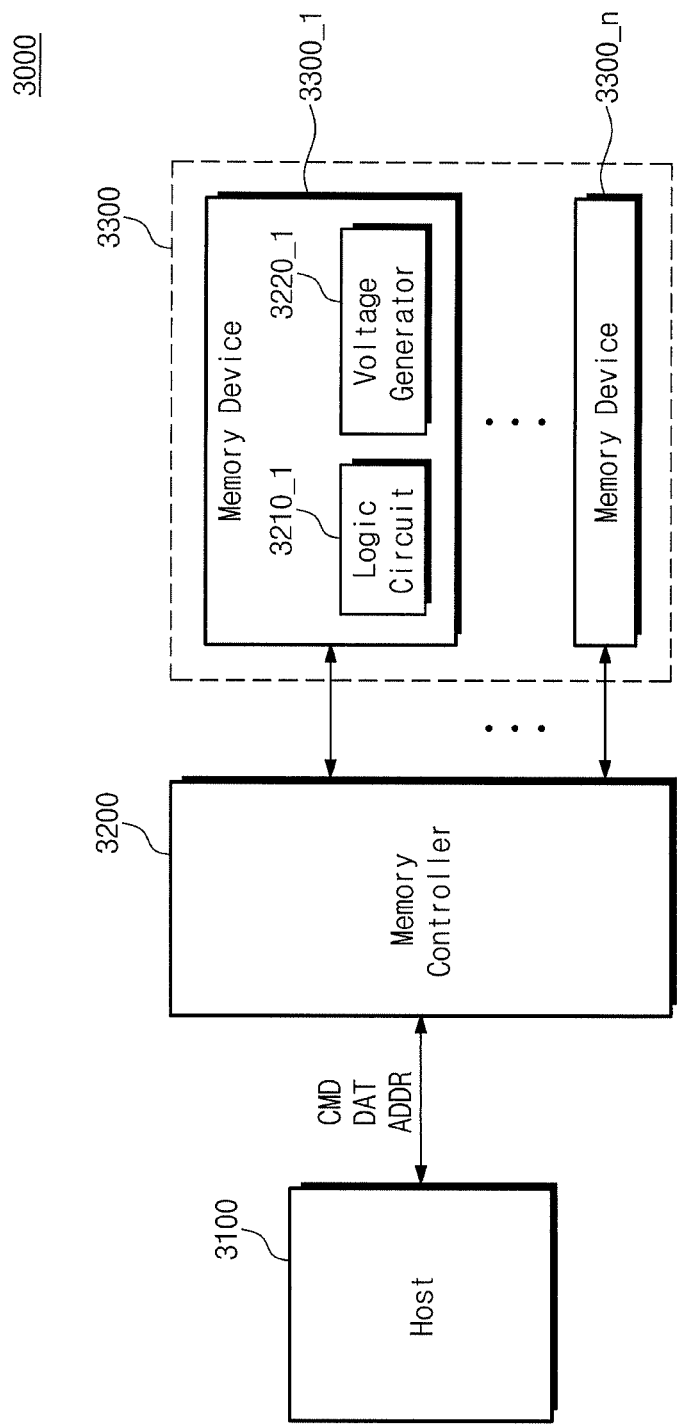
FIG. 16 is a block diagram illustrating an example memory system including the read voltage generating circuits of FIGS. 1 and/or 4 according to some embodiments of the inventive concepts.

FIG. 16 is a block diagram illustrating an example memory system including the read voltage generating circuits of FIGS. 1 and/or 4 according to some embodiments of the inventive concepts.

A memory system 3000 may include a host 3100, a memory controller 3200 and a memory device 3300. The memory device 3300 may include memory devices 3300_1 to 3300_n. Each of the memory devices 3300_1 to 3300_n may include a logic circuit and a voltage generator. For example, the memory device 3300_1 may include a logic circuit 3210_1 and a voltage generator 3220_1.

The memory controller 3200 may exchange a command signal CMD, a data signal DAT, and an address signal ADDR with the host 3100. The command signal CMD may be associated with operations of the memory device 3300. The data signal DAT may indicate data which are stored or will be stored in the memory device 3300. The address signal ADDR may indicate an address of a specific memory cell in the memory device 3300 corresponding to a location where data are stored or will be stored.

The voltage generator 3220_1 may generate the voltages Vztc and Vntc and the reference voltage Vref of FIGS. 1 and 4. For example, the voltage generator 3220_1 may generate the voltages Vztc and Vntc based on a temperature of the memory system 3000. The logic circuit 3210_1 may generate the codes TC1 and TC2 of FIG. 1 and the code TC of FIG. 4.

Each of the memory devices 3300_1 to 3300_n may include at least one of the read voltage generating circuits 1000 and 2000 of FIGS. 1 and 4. Each of the memory devices 3300_1 to 3300_n may generate the read voltage Vread 1 or Vread2 based on the voltages Vztc and Vntc, the reference voltage Vref, the codes TC1 and TC2, and the code TC. For example, the logic circuit 3220 may track a change of threshold voltages of memory cells in the memory device 3300 to determine values of the codes TC1 and TC2 and a value of the code TC. The logic circuit 3220 may output the codes TC1, TC2, and TC of the determined values to the memory device 3300.

The memory devices 3300_1 to 3300_n of the memory device 3300 may store or output data under control of the memory controller 3200. The memory devices 3300_1 to 3300_n may read data by using the read voltage Vread 1 or Vread2. The memory devices 3300_1 to 3300_n may have the same configuration or may have similar configurations. Alternatively, the memory devices 3300_1 to 3300_n may have different configurations.

For example, each of the memory devices 3300_1 to 3300_n may include a volatile memory such as an SRAM, a DRAM, an SDRAM, etc. or a nonvolatile memory such as a flash memory, a PRAM, an MRAM, a ReRAM, a FRAM, etc. Alternatively, the memory devices 3300_1 to 3300_n may include heterogeneous memories.

According to some embodiments of the inventive concepts, an electronic circuit which generates a read voltage having a magnitude that varies as a temperature and a value of a code vary, may be provided.

While the inventive concepts has been described with reference to exemplary embodiments thereof, it will be apparent to those of ordinary skill in the art that various changes and modifications may be made thereto without departing from the spirit and scope of the inventive concepts as set forth in the following claims.

What is claimed is:

1. A compensation circuit comprising:
   a reference current generating circuit comprising a first transistor of a first width configured to transfer a first current, the reference current generating circuit configured to output a reference current based on the first current;
   a compensation current generating circuit comprising a second transistor of a second width configured to transfer a second current, the second transistor selected from among a first group of transistors based on a code, the transistors of the first group having widths proportional to the first width, respectively, the compensation current generating circuit configured to output a compensation current having a magnitude selected to be proportional to a magnitude of the reference current based on the second current;
   a current mirror circuit configured to output a compensation voltage having a magnitude that is based on a magnitude of the second current; and
   an output transistor configured to output a sensing voltage based on the compensation voltage,
   wherein with respect to a first value, a second value, and a third value of the code, when a difference between the first value and the second value is identical to a difference between the second value and the third value, a difference between a first magnitude of the sensing voltage output based on the first value and a second magnitude of the sensing voltage output based on the second value corresponds to a difference between the second magnitude and a third magnitude of the sensing voltage output based on the third value.

2. The compensation circuit of claim 1, wherein the reference current generating circuit further comprises:
   a first current source configured to output the reference current; and
   a third transistor having the first width and configured to transfer a third current for outputting the reference current to the first current source.

3. The compensation circuit of claim 2, wherein the magnitude of the reference current corresponds to a sum of a magnitude of the first current and a magnitude of the third current.

4. The compensation circuit of claim 2, wherein the compensation current generating circuit further comprises:
   a second current source configured to output the compensation current; and
   a fourth transistor having the second width and configured to transfer a fourth current for outputting the compensation current to the second current source.

5. The compensation circuit of claim 4, further comprising a direction selecting circuit configured to:
   receive a first gate voltage, a magnitude of which varies with a change of a temperature, and a second gate voltage, a magnitude of which is uniform regardless of a change in the temperature;
   output the first gate voltage to a gate terminal of the second transistor and the second gate voltage to a gate terminal of the fourth transistor in response to a first logical value of a selection signal; and
   output the first gate voltage to the gate terminal of the fourth transistor and the second gate voltage to the gate terminal of the second transistor in response to a second logical value of the selection signal.

6. The compensation circuit of claim 4, wherein the second current source comprises a fifth transistor configured to transfer a fifth current in response to a reference value of the code for outputting the compensation current, and
   wherein the magnitude of the compensation current is increased by a magnitude of the fifth current based on a value of the code being increased by the reference value.

7. The compensation circuit of claim 4, wherein the magnitude of the compensation current corresponds to a sum of the magnitude of the second current and a magnitude of the fourth current.

8. The compensation circuit of claim 4, wherein the second transistor includes a gate terminal receiving a first temperature dependent voltage, and
   wherein a magnitude of the first temperature dependent voltage varies with a temperature.

9. The compensation circuit of claim 8, wherein the fourth transistor comprises a gate terminal receiving a second temperature dependent voltage, and
   wherein the magnitude of the sensing voltage is determined based further on a difference between the first temperature dependent voltage and the second temperature dependent voltage.

10. The compensation circuit of claim 4, wherein the fourth transistor is selected from a second group of transistors based on the code, wherein the transistors of the second group of transistors are configured to have widths proportional to the first width, respectively.

11. The compensation circuit of claim 4, wherein the current mirror circuit comprises:
    a sixth transistor comprising a first end configured to output the compensation voltage, the sixth transistor configured to transfer the second current to the second transistor and to transfer the third current to the third transistor; and
    a seventh transistor comprising a gate terminal electrically connected to a gate terminal of the sixth transistor, the seventh transistor configured to transfer the first current to the first transistor and to transfer the fourth current to the fourth transistor.

12. The compensation circuit of claim 1, wherein the reference current generating circuit is configured to output the reference current of a fixed magnitude.

13. A compensation circuit comprising:
    a reference current generating circuit configured to output a reference current of a fixed magnitude;
    a compensation current generating circuit configured to output a compensation current having a magnitude selected proportionally to a magnitude of the reference current based on a code;
    a current mirror circuit configured to output to the reference current generating circuit a first current based on the reference current, to output a second current based on the compensation current, and to output a compensation voltage based on the first current and the second current; and
    an output transistor configured to output a sensing voltage based on the compensation voltage,
    wherein a magnitude of the sensing voltage is associated with a magnitude of the second current such that the magnitude of the sensing voltage is a reference magnitude when the code is a reference value, and the magnitude of the second current is increased by the reference magnitude when a value of the code is increased by the reference value.

14. The compensation circuit of claim 13, wherein the reference current generating circuit comprises a first transistor having a first width, the first transistor configured to transfer the first current for outputting the reference current,
    wherein the compensation current generating circuit comprises a second transistor having a second width proportional to the first width of the first transistor, the second transistor configured to transfer the second current for outputting the compensation current.

15. The compensation circuit of claim 14, wherein the second transistor is selected from a group of transistors based on the code, the transistors of the group of transistors having widths proportional to the first width.

16. The compensation circuit of claim 14, wherein the compensation current generating circuit further comprises a third transistor configured to transfer a third current based on the second current transferred from the second transistor, and
    wherein a magnitude of the compensation current is increased by a magnitude of the third current whenever the value of the code is increased by the reference value.

17. A voltage generating circuit comprising:
    a compensation circuit configured to respectively receive a reference voltage, a feedback voltage, a first temperature dependent voltage, a second temperature independent voltage, and a code having a value which is variable and output a compensation voltage having a magnitude that is based on the code, based on the first temperature dependent voltage, and based on the second temperature independent voltage, the first temperature dependent voltage having a magnitude which varies with a temperature and the second temperature independent voltage having a magnitude that is uniform regardless of the temperature; and an output transistor configured to output a sensing voltage having a magnitude that is based on a magnitude of the compensation voltage, wherein the voltage generating circuit is configured to produce the sensing voltage having a magnitude that is proportional to a value of the code, and is associated with a difference between a magnitude of the first temperature dependent voltage and a magnitude of the second temperature independent voltage.

18. The voltage generating circuit of claim 17, wherein the compensation circuit is configured to receive the feedback voltage having a magnitude that is based on the magnitude of the sensing voltage, and to output the compensation voltage based further on the feedback voltage.

19. The voltage generating circuit of claim 17, wherein the compensation circuit includes a plurality of transistors, wherein the compensation circuit is configured to select one or more transistors from the plurality of transistors based on the code such that the selected one or more transistors transfer a current in response to the first temperature dependent voltage, and wherein the compensation voltage is output based on the current.

20. The voltage generating circuit of claim 17, wherein the magnitude of the first temperature dependent voltage is negatively proportional to the temperature, and wherein the magnitude of the sensing voltage is proportional to a value obtained by subtracting the magnitude of the first temperature dependent voltage from the magnitude of the second temperature independent voltage.

* * * * *